(12) United States Patent
Morishita et al.

(10) Patent No.: US 10,320,433 B2
(45) Date of Patent: Jun. 11, 2019

(54) RADIO RECEIVING DEVICE AND TRANSMITTING AND RECEIVING DEVICE

(71) Applicant: Panasonic Corporation, Osaka (JP)

(72) Inventors: Yohei Morishita, Kanagawa (JP); Takenori Sakamoto, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 15/924,717

(22) Filed: Mar. 19, 2018

(65) Prior Publication Data
US 2018/0287647 A1 Oct. 4, 2018

(30) Foreign Application Priority Data

Mar. 28, 2017 (JP) .................................. 2017-063018
Dec. 27, 2017 (JP) .................................. 2017-251923

(51) Int. Cl.
*H04B 1/16* (2006.01)
*H03G 3/30* (2006.01)
*H04B 1/00* (2006.01)

(52) U.S. Cl.
CPC ............. *H04B 1/16* (2013.01); *H03G 3/3042* (2013.01); *H03G 3/3052* (2013.01); *H03G 3/3078* (2013.01); *H03G 2201/302* (2013.01); *H03G 2201/307* (2013.01); *H04B 1/0028* (2013.01)

(58) Field of Classification Search
CPC ........ H03G 3/001; H03G 3/20; H03G 3/3042; H03G 2201/307; H03F 2200/168; H04L 1/0036; H04L 27/2647; H04B 1/16; H04B 1/0028
See application file for complete search history.

(56) References Cited

U.S. PATENT DOCUMENTS

| 7,656,970 B1* | 2/2010 | Sankabathula ....... H04L 43/024 375/316 |
| 9,571,053 B1* | 2/2017 | Cousinard .............. A42B 3/225 |
| 2003/0142767 A1 | 7/2003 | Ichihara |

(Continued)

FOREIGN PATENT DOCUMENTS

| JP | 10-247953 | 9/1998 |
| JP | 2003-224489 | 8/2003 |

OTHER PUBLICATIONS

Behzad Razavi, "Design of Analog CMOS Integrated Circuits", 12.2.2 Speed Considerations, Mar. 30, 2003, pp. 414-417.

*Primary Examiner* — Sophia Vlahos
(74) *Attorney, Agent, or Firm* — Seed IP Law Group LLP

(57) ABSTRACT

A gain controller sets a gain code indicating an optimum gain, a cutoff frequency code indicating a cutoff frequency, and a number of bits code indicating a number of bits. An AEQ/VGA gain controller sets a frequency characteristic code indicating a frequency characteristic, a gain code indicating a gain after correction, and a number of bits code indicating a number of bits. An AEQ/VGA amplifies a baseband received signal on the basis of a gain code and corrects a frequency characteristic of the baseband received signal on the basis of a frequency characteristic code. An HPF cuts off a band below a cutoff frequency of an output signal from the AEQ/VGA on the basis of a cutoff frequency code. An ADC quantizes an output signal from the HPF using a number of bits based on a number of bits code and generates a digital received signal.

11 Claims, 21 Drawing Sheets

(56) References Cited

U.S. PATENT DOCUMENTS

| | | | | |
|---|---|---|---|---|
| 2004/0097212 A1* | 5/2004 | Matsumoto | .......... | H03G 3/3068 |
| | | | | 455/296 |
| 2005/0180287 A1* | 8/2005 | Lee | .................. | G11B 20/10009 |
| | | | | 369/59.15 |
| 2007/0230640 A1* | 10/2007 | Bryan | ............... | H04L 25/03057 |
| | | | | 375/349 |
| 2009/0060102 A1* | 3/2009 | Wong | ..................... | H03G 3/001 |
| | | | | 375/345 |
| 2017/0194925 A1* | 7/2017 | Moon | ...................... | H04B 1/16 |
| 2018/0287837 A1* | 10/2018 | Zhang | ................... | H03M 1/182 |

* cited by examiner

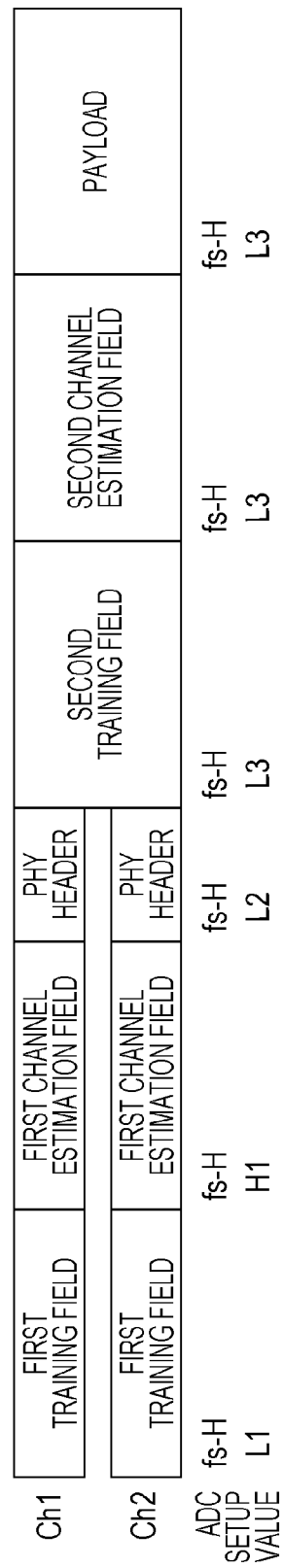

RADIO RECEIVING DEVICE AND TRANSMITTING AND RECEIVING DEVICE

BACKGROUND

1. Technical Field

The present disclosure relates to a radio receiving device and a transmitting and receiving device used for millimeter-wave radio communication.

2. Description of the Related Art

Devices which handle broadband and high-frequency signals and are available for millimeter-wave radio communication have been under development in recent years. For this reason, enhancement of a sampling rate in an analog/digital converter of a radio receiving device is being considered in millimeter-wave radio communication.

Power consumption of an analog/digital converter is proportional to a sampling rate and a number of bits for analog signal quantization. For this reason, if a millimeter-wave high-frequency signal (radio frequency signal) is processed in a configuration of a receiving device according to Japanese Unexamined Patent Application Publication No. 2003-224489, power consumption of an analog/digital converter increases.

SUMMARY

No sufficient study has been made to reduce power consumption of an analog/digital converter in millimeter-wave radio communication.

One non-limiting and exemplary embodiment provides a radio receiving device capable of reducing power consumption of an analog/digital converter without lowering a sampling rate.

In one general aspect, the techniques disclosed here feature a radio receiving device including a frequency converting circuit which frequency-converts a radio-frequency received signal having a gain adjustment period, a channel estimation period, and a signal reception period into a baseband received signal, at least one frequency characteristic correcting circuit which generates a corrected baseband received signal by amplifying the baseband received signal on the basis of a gain code and correcting a frequency characteristic in the baseband received signal on the basis of a frequency characteristic code, at least one filter circuit which generates a filtered baseband received signal by cutting off a a band below a cutoff frequency of the baseband received signal on the basis of a cutoff frequency code, an analog/digital conversion circuit which quantizes the filtered baseband received signal into a digital received signal using a number of bits based on a number of bits code, a digital signal processing circuit which demodulates the digital received signal and estimates a frequency characteristic, and a controller which sets the frequency characteristic code, the gain code, the cutoff frequency code, and the number of bits code.

According to the one aspect of the present disclosure, since a frequency characteristic derived from a radio circuit and a propagation path can be reduced before a received signal is input to the analog/digital converter, a number of bits for the analog/digital converter can be lowered. Thus, power consumption of the analog/digital converter can be reduced without lowering a sampling rate.

It should be noted that general or specific embodiments may be implemented as a system, an apparatus, a method, an integrated circuit, a computer program, a recording medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 17B is a diagram showing ADC setup values for the frame format according to the fifth embodiment of the present disclosure;

DETAILED DESCRIPTION

Embodiments of the present disclosure will be described below in detail with appropriate reference to the drawings.

First Embodiment

<Configuration of Radio Receiving Device>

Figure 1:
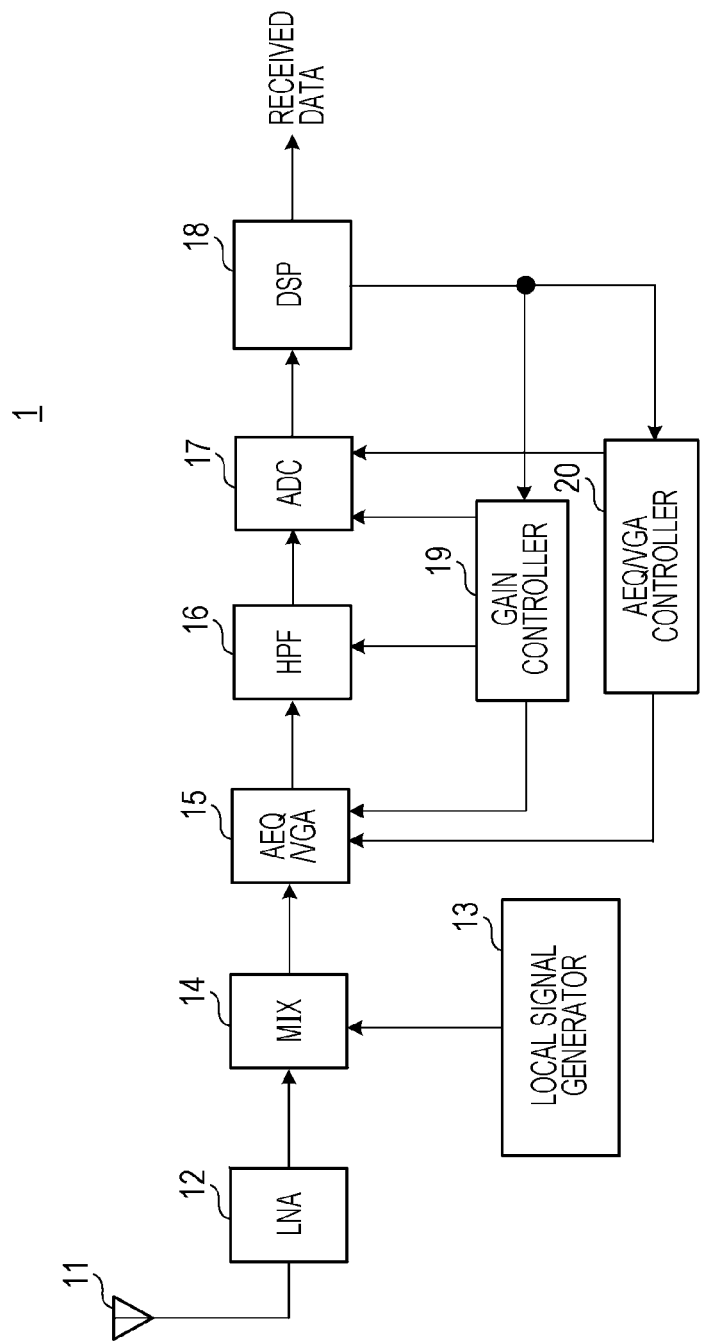
FIG. 1 is a block diagram showing an example of the configuration of a radio receiving device according to a first embodiment of the present disclosure.

FIG. 1 is a block diagram showing an example of the configuration of a radio receiving device 1 according to a first embodiment. In FIG. 1, the radio receiving device 1 includes a receiving antenna 11, a low noise amplifier (LNA) 12, a local signal generator 13, a mixer (MIX) 14, an analog equalizer/variable gain amplifier (AEQ/VGA) 15, a high-pass filter (HPF) 16, an analog/digital converter (ADC) 17, a digital signal processor (DSP) 18, a gain controller 19, and an AEQ/VGA controller 20.

The receiving antenna 11 receives a millimeter-wave high-frequency signal and outputs the millimeter-wave high-frequency signal to the LNA 12. Note that the receiving antenna 11 may be composed of a plurality of antenna elements.

The LNA 12 amplifies the high-frequency (radio-frequency) received signal output from the receiving antenna 11 and outputs the high-frequency (radio-frequency) received signal to the MIX 14.

The local signal generator 13 generates a local signal for downconversion (frequency conversion) in the MIX 14 and supplies the local signal to the MIX 14.

The MIX 14 downconverts the high-frequency (radio-frequency) received signal output from the LNA 12 using the local signal supplied from the local signal generator 13 to generate a baseband received signal and outputs the baseband received signal to the AEQ/VGA 15.

The AEQ/VGA 15 sets a gain on the basis of a gain code output from the gain controller 19 or the AEQ/VGA controller 20 and performs an amplification process of increasing or decreasing the level of the received signal output from the MIX 14 using the set gain. The AEQ/VGA 15 performs an analog equalization process of correcting a frequency characteristic in the received signal output from the MIX 14 on the basis of a frequency characteristic code output from the AEQ/VGA controller 20 and shapes a waveform of the received signal. The AEQ/VGA 15 outputs the received signal after the amplification process and the analog equalization process to the HPF 16.

A dynamic range (a number of bits) of the ADC 17 is calculated on the basis of the sum of (element 1) a signal to noise ratio (SNR) [dB] or an error vector magnitude (EVM) [dB] required for demodulation of a modulated signal, (element 2) a gain deviation [dB] in a band due to a frequency characteristic of a propagation path and a frequency characteristic of a radio circuit (the radio receiving device 1), and (element 3) a design margin. Since reduction of (element 2) by the AEQ/VGA 15 allows the ADC 17 to lower the number of bits in the present disclosure, the radio receiving device 1 can reduce power consumption.

The HPF 16 sets a cutoff frequency on the basis of a cutoff frequency code output from the gain controller 19, cuts off a received signal in a band below the cutoff frequency of the received signal output from the AEQ/VGA 15, and outputs a received signal left after the cutoff to the ADC 17. Although a configuration in which the HPF 16 is connected at a stage subsequent to the AEQ/VGA 15 is shown in FIG. 1, the HPF 16 may be connected at a stage prior to the AEQ/VGA 15 or the HPFs 16 may be connected at both stages prior to and subsequent to the AEQ/VGA 15 in the present embodiment.

The ADC 17 quantizes the analog received signal output from the HPF 16 using a number of bits based on a number of bits code output from the gain controller 19 or the AEQ/VGA controller 20 to generate a digital received signal and outputs the digital received signal to the DSP 18.

The DSP 18 demodulates the received signal output from the ADC 17 by performing digital signal processing on the received signal in accordance with a predetermined demodulation scheme. A digital value of the level of the received signal input to the DSP 18 is output to a stage (not shown) subsequent to the radio receiving device 1 and to the gain controller 19. The DSP 18 also estimates the frequency characteristic of the radio circuit and the frequency characteristic of the propagation path and outputs a signal indicating an estimation result to the AEQ/VGA controller 20. Note that any other processor, such as a central processing unit (CPU), may be used instead of the DSP 18.

The gain controller 19 compares a digital value of the level of a received signal output from the DSP 18 with an optimum received signal level which is determined from the dynamic range of the ADC 17 in each of an auto gain control (AGC) period and a channel estimation period after the AGC period. The gain controller 19 determines an optimum gain for the AEQ/VGA 15 which conforms to the dynamic range of the ADC 17 on the basis of a comparison result. The gain controller 19 outputs a gain code indicating the optimum gain to the AEQ/VGA 15.

The gain controller 19 sets a cutoff frequency for the HPF 16 in each of the AGC period and the channel estimation period and outputs a cutoff frequency code indicating the cutoff frequency to the HPF 16.

The gain controller 19 sets a number of bits for quantization for the ADC 17 and outputs a number of bits code indicating the number of bits to the ADC 17 in each of the AGC period and the channel estimation period.

The AEQ/VGA controller 20 determines a frequency characteristic correction amount and a gain correction amount for the AEQ/VGA 15 in a signal reception period after the channel estimation period such that a frequency characteristic in an output signal from the AEQ/VGA 15 is an inverse of a frequency characteristic estimated by the DSP 18. For this reason, although an output signal from the MIX 14 (an input signal to the ADC 17 before frequency characteristic correction) includes the frequency characteristic of the radio circuit and the frequency characteristic of the propagation path, the frequency characteristic of the radio circuit and the frequency characteristic of the propagation path can be removed by performing frequency characteristic and gain correction using the frequency characteristic and gain correction amounts in the AEQ/VGA 15 (a frequency characteristic becomes flat). The AEQ/VGA controller 20 outputs a frequency characteristic code indicating a frequency characteristic and a gain code indicating a gain after correction to the AEQ/VGA 15.

The AEQ/VGA controller 20 further sets a number of bits for quantization for the ADC 17 and outputs a number of bits code indicating the number of bits to the ADC 17 in the signal reception period.

<Variation of Configuration of Radio Receiving Device>

Figure 2:
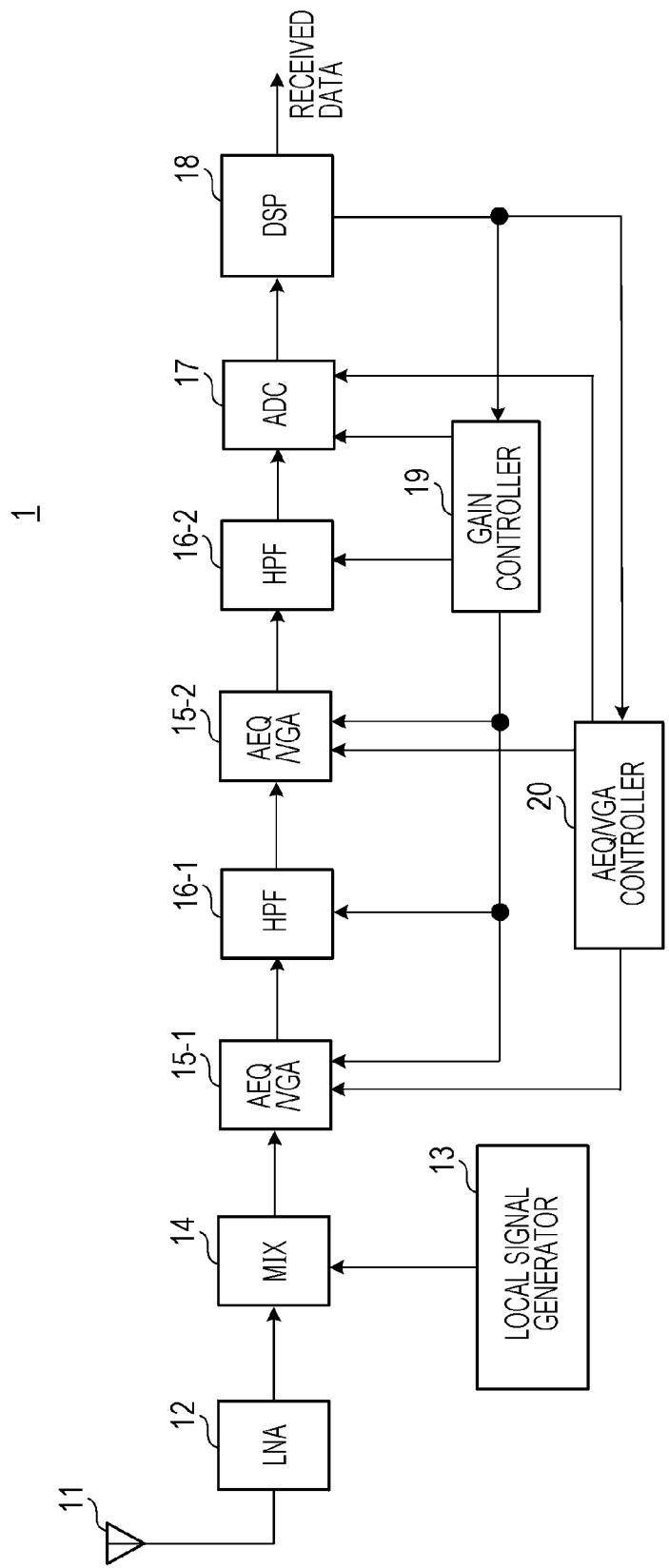
FIG. 2 is a block diagram showing another example of the configuration of the radio receiving device according to the first embodiment of the present disclosure.

Although the AEQ/VGA 15 and the HPF 16 as one set are provided in the radio receiving device 1 in FIG. 1, the number of sets of AEQ/VGAs 15 and HPFs 16 is arbitrary in the present embodiment. As shown in FIG. 2, the AEQ/VGAs 15 and the HPFs 16 as two sets may be provided. If the AEQ/VGAs 15 and the HPFs 16 as a plurality of sets are provided, element values in the AEQ/VGAs 15 in each set may be different from each other.

Note that although an AEQ/VGA 15-1, an HPF 16-1, an AEQ/VGA 15-2, and an HPF 16-2 are connected in this order in FIG. 2, the HPF 16-1, the AEQ/VGA 15-1, the HPF 16-2, and the AEQ/VGA 15-2 may be connected in this order in the present embodiment.

Figure 3:
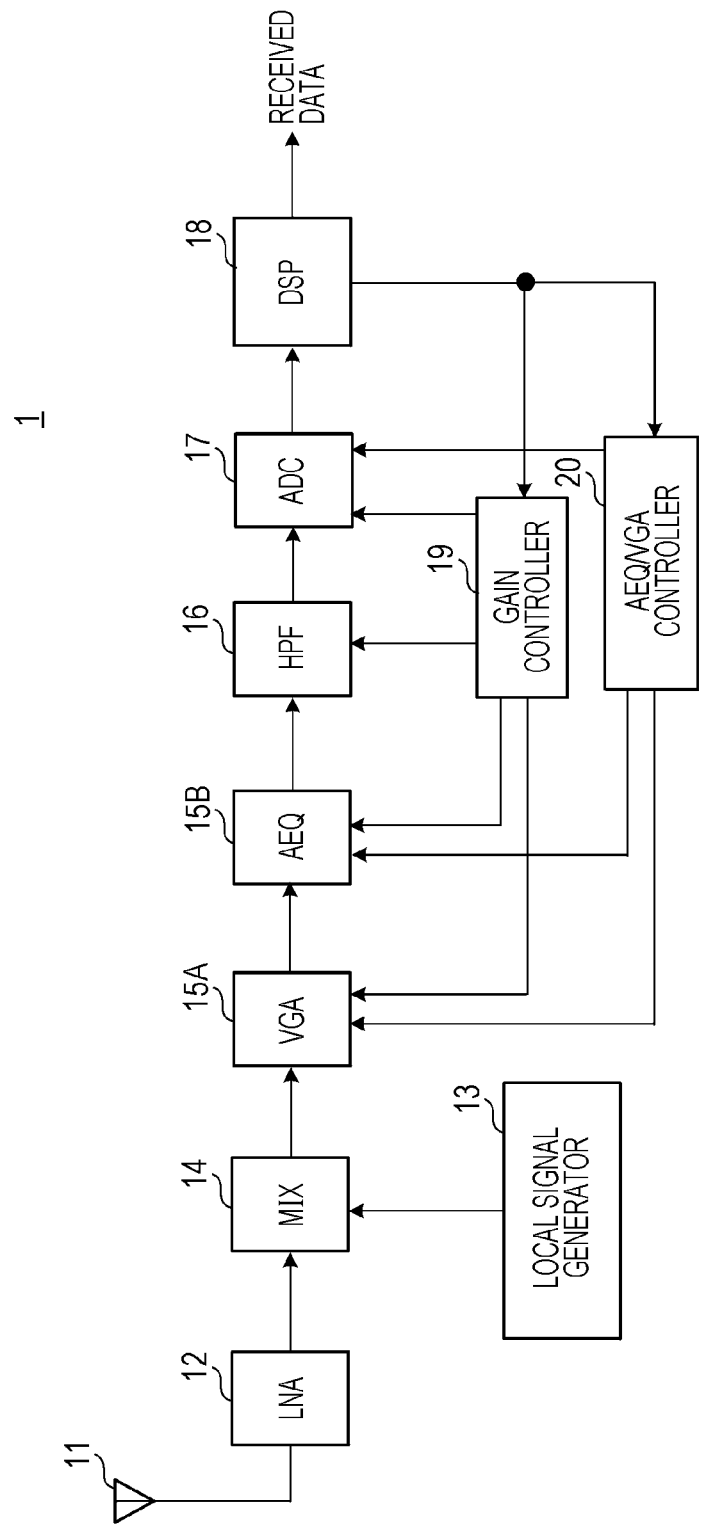
FIG. 3 is a block diagram showing still another example of the configuration of the radio receiving device according to the first embodiment of the present disclosure.

Although the example in FIG. 1 illustrates a case where frequency characteristic adjustment and gain adjustment are both performed in the AEQ/VGA 15, the present embodiment is not limited to this. As shown in FIG. 3, the AEQ/VGA 15 may be divided into a VGA 15A which performs gain adjustment (the amplification process) and an AEQ 15B which performs frequency characteristic correction (the analog equalization process).

Although the VGA 15A and the AEQ 15B are connected in this order in FIG. 3, the AEQ 15B and the VGA 15A may be connected in this order in the present embodiment. The HPF 16 may be added between the VGA 15A and the AEQ 15B or an arbitrary number of HPFs 16 may be arranged at a stage prior to or subsequent to the AEQ 15B or at a stage prior to or subsequent to the VGA 15A.

Note that although the gain controller 19 and the AEQ/VGA controller 20 are illustrated as separate components in FIGS. 1, 2, and 3, the gain controller 19 and the AEQ/VGA controller 20 may be integrated to perform gain control, AEQ/VGA control, and number of bits control of the ADC 17 upon receipt of a processing result from the DSP 18. The control of the ADC 17 may be performed by either one of the gain controller 19 and the AEQ/VGA controller 20.

<Frame Format>

Figure 4:
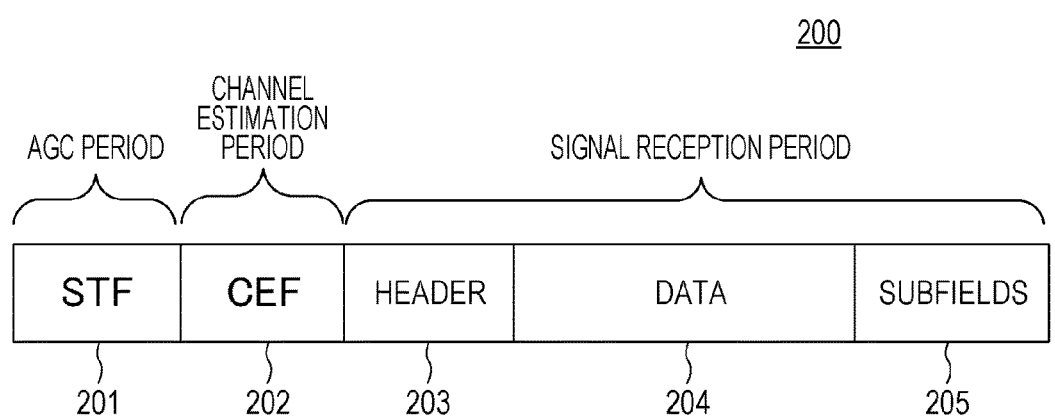
FIG. 4 is a diagram showing an example of a frame format.

FIG. 4 shows a frame format for IEEE 802.11ad in a millimeter-wave broadband radio system. In FIG. 4, a frame format 200 is divided into fields, a short training field (STF) 201, a channel estimation field (CEF) 202, a header 203, data 204, and subfields 205.

The radio receiving device 1 performs gain adjustment using the STF 201 in an AGC period (about 1.2 µs). The radio receiving device 1 estimates the frequency characteristic of the radio circuit and the frequency characteristic of the propagation path using the CEF 202 in a channel estimation period. The radio receiving device 1 receives (demodulates) the header 203, the data 204, and the subfields 205 in a signal reception period.

<Control Flow>

The flow of gain, frequency characteristic, and number of bits control in the radio receiving device 1 in a case where the radio receiving device 1 receives the frame format 200 will be described with reference to FIG. 5.

In millimeter-wave communication, an AGC period is as short as about 1.2 µs, and an AGC settling time is desirably about 600 ns. For this reason, a cutoff frequency fc of the HPF 16 is set to several hundreds of MHz. Thus, the radio receiving device 1 sets a cutoff frequency HPF-fc of the HPF 16 to a first cutoff frequency value fc-H at the start of an AGC period (at the start of reception of the STF 201 or before the STF reception). The radio receiving device 1 also sets a frequency characteristic AEQ-F in a signal output from the AEQ/VGA 15 to a value A at which the frequency characteristic AEQ-F is flat in a signal band and sets a number of bits ADC-RES of the ADC 17 to a first number of bits L (ST301). The radio receiving device 1 also sets a gain AEQ-G of the AEQ/VGA 15 to a standard value Ave. Here, fc-H is a cutoff frequency value at which the AGC settling time is about 600 ns, and L is a number of bits not more than a number of bits required for channel (frequency characteristic) estimation but sufficient for AGC.

If the STF 201 is received in the above-described state, the gain controller 19 performs gain adjustment of the AEQ/VGA 15 (ST302). For example, the gain controller 19 repeats adjustment of the setting of the gain AEQ-G of the AEQ/VGA 15 on the basis of whether the level of a received signal output from the ADC 17 exceeds a threshold. The gain controller 19 first performs coarse adjustment by binary search and then performs fine adjustment by linear search.

After completion of the adjustment of the gain AEQ-G of the AEQ/VGA 15 (a gain adjusted value), the gain controller 19 sets the cutoff frequency HPF-fc of the HPF 16 to a second cutoff frequency value fc-L to avoid deterioration of communication quality at the time of data modulation. Since an amplitude of a received signal changes with the change of the cutoff frequency of the HPF 16, the gain controller 19 corrects the gain AEQ-G of the AEQ/VGA 15 so as to cancel out the change in amplitude (a first gain correction value).

The above-described correction allows prevention of rise in an error rate for a received signal. Note that the first gain correction value is estimated in advance. The gain controller 19 sets the number of bits ADC-RES of the ADC 17 to a second number of bits H to estimate the frequency characteristic of the radio circuit and the frequency characteristic of the propagation path with high accuracy (ST303). Here, fc-L is a cutoff frequency value at which deterioration of the accuracy of demodulation of a received signal by the HPF 16 can be reduced to an allowable level, and the second number of bits H is a number of bits sufficient for channel (frequency characteristic) estimation.

If the CEF 202 is received in the state set in ST303, the DSP 18 estimates the frequency characteristic of the radio circuit and the frequency characteristic of the propagation path on the basis of a received signal output from the ADC 17 (ST304).

The AEQ/VGA controller 20 sets the frequency characteristic AEQ-F of the AEQ/VGA 15 to a value B such that the frequency characteristic AEQ-F is an inverse of an estimated value from the DSP 18. Since an amplitude of a received signal changes with the change of the frequency characteristic, the AEQ/VGA controller 20 corrects the gain AEQ-G of the AEQ/VGA 15 so as to cancel out the change in amplitude (a second gain correction value). Since the correction allows a gain deviation in a signal band due to the frequency characteristic of the radio circuit and the frequency characteristic of the propagation path to be reduced before a received signal is input to the ADC 17, a number of bits required of the ADC 17 is lowered. For this reason, the AEQ/VGA controller 20 sets the number of bits ADC-RES of the ADC 17 to the first number of bits L again (ST305). Here, L is a number of bits sufficient for demodulation and has a smaller value than that of H at the time of the frequency characteristic estimation. Alternatively, L in ST301 and L in ST305 may have different values.

The radio receiving device 1 receives (demodulates) the header 203 and the data 204 in the above-described state (ST306).

Figure 5:
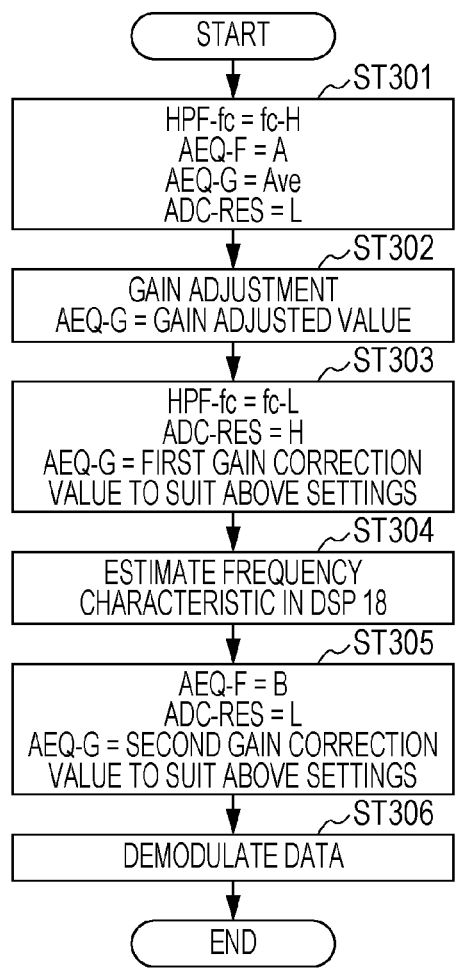
FIG. 5 is a flowchart showing the flow of control in the radio receiving device according to the first embodiment of the present disclosure.

Note that although correction of the gain AEQ-G, setting of the cutoff frequency HPF-fc, setting of the frequency characteristic AEQ-F of the AEQ/VGA 15, and setting of the number of bits ADC-RES are described as being performed in the same step in FIG. 5, the processes are not always performed simultaneously (in parallel). The processes may be performed in order (serially).

<Effects>

As described above, in the present embodiment, gain correction that copes with a change in amplitude associated with change of the cutoff frequency is performed, and gain correction that copes with a change in amplitude associated with change of the frequency characteristic is performed. Since the frequency characteristic of the radio circuit and the frequency characteristic of the propagation path can be reduced before a received signal is input to the ADC 17, the number of bits used in the ADC 17 can be lowered. Thus, power consumption of the ADC 17 can be reduced without lowering a sampling rate.

Note that a setup value for the frequency characteristic of the AEQ/VGA 15 and a setup value for the gain after frequency characteristic estimation are not limited to values, at which the frequency characteristic is an inverse of an estimated value, in the present embodiment and may be values which reduce fluctuations in a frequency characteristic as an estimated value.

Although the present embodiment has described a case where a signal with the frame format for IEEE 802.11ad in FIG. 4 is received, the present disclosure is not limited to this and can be applied to a case where a signal with another frame format is received.

Although the present embodiment also has described a case where the number of bits of the ADC 17 is set to the first number of bits L smaller than the second number of bits H in an AGC period, the number of bits of the ADC 17 during an AGC period may be set to the second number of bits H larger than the first number of bits L in the present disclosure to detect a signal with a level not higher than a noise level through pattern matching.

For example, the number of bits of the ADC 17 may be set to the first number of bits L at the start of the STF 201 in FIG. 4 in basic mode. If received power is judged to be not more than noise power, an operation of setting the number of bits of the ADC 17 to the second number of bits H may be performed.

A configuration in which one ADC 17 is provided and is used while the number of bits of the ADC 17 is switched has been described as for the ADC 17. A plurality of ADCs 17 different in number of bits may be prepared, and the ADC 17 to be used may be switched in accordance with a desired number of bits.

In the frame format in FIG. 4, a modulation scheme, such as BPSK, which requires a smaller SNR for demodulation is assumed to be used for the header and the subfields. The number of bits of the ADC 17 may be made smaller for the header and the subfields than for the data.

In the present disclosure, gain adjustment in the radio receiving device 1 may include LNA gain, mixer gain, and local amplitude adjustment.

Second Embodiment

A second embodiment will describe a case where a continuous time/discrete time (CT/DT) hybrid circuit is used as an AEQ/VGA 15.

<Configuration of CT/DT Hybrid Circuit>

The configuration of a main portion of a CT/DT hybrid circuit 100 according to the present embodiment will be described with reference to FIG. 6. The CT/DT hybrid circuit 100 shown in FIG. 6 corresponds to the AEQ/VGA 15 of the radio receiving device 1 shown in FIG. 1 and performs frequency characteristic correction and gain adjustment.

Figure 6:
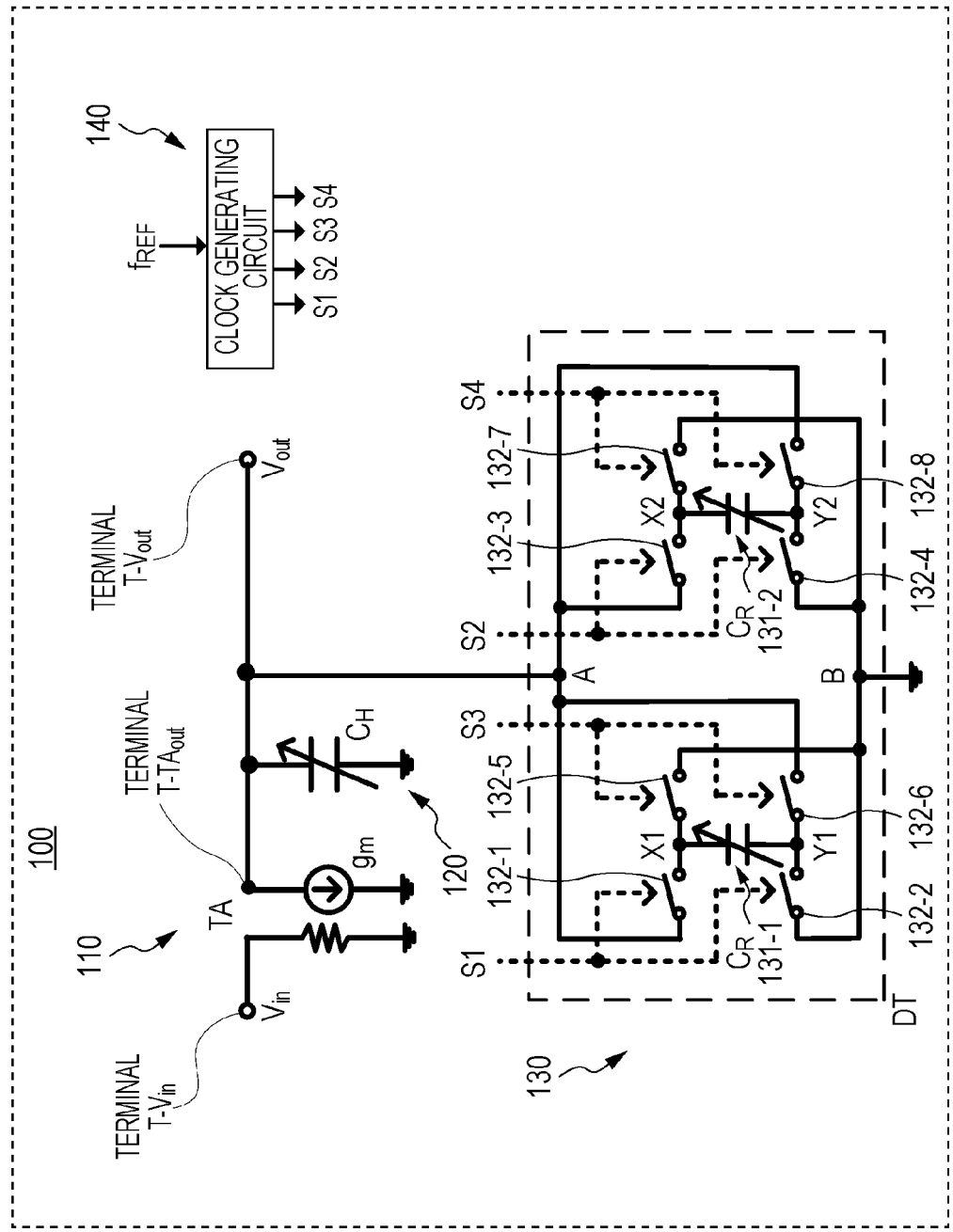
FIG. 6 is a CT/DT hybrid circuit according to a second embodiment of the present disclosure.

The CT/DT hybrid circuit 100 shown in FIG. 6 includes a transconductance amplifier (TA) (a voltage-to-current conversion circuit) 110, a capacitance 120, a charge inverting circuit 130, and a clock generating circuit 140. A baseband analog signal is input to the CT/DT hybrid circuit 100 through an input terminal T-$V_{in}$. The CT/DT hybrid circuit 100 performs frequency characteristic correction on the input analog signal in the TA 110 and the charge inverting circuit 130 and outputs an output voltage signal $V_{out}$ through an output terminal T-$V_{out}$.

The TA 110 is a voltage-to-current conversion circuit. The TA 110 receives an input analog signal as an input voltage signal $V_{in}$ and converts the input voltage signal $V_{in}$ into a current ($g_m \times V_{in}$). Note that $g_m$ is a value of transconductance of the TA 110.

The capacitance 120 has one terminal connected to an output terminal T-$TA_{out}$ of the TA 110 and has the other terminal connected to GND. The capacitance 120 has a capacitance value $C_H$.

The charge inverting circuit 130 has a terminal A connected to the output terminal T-$TA_{out}$ of the TA 110 and has a terminal B connected to GND. The charge inverting circuit 130 is a circuit which performs an operation of holding charge and an operation of inverting charge and forming a connection. The charge inverting circuit 130 performs charge sharing on the basis of a control signal supplied from the clock generating circuit 140 and performs frequency characteristic correction on an input analog signal and gain adjustment. Note that a concrete configuration of the charge inverting circuit 130 will be described later.

Figure 7:
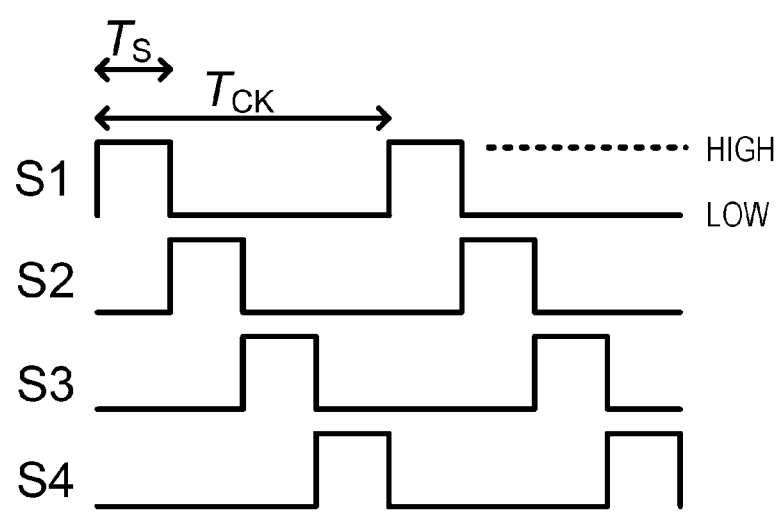
FIG. 7 is a timing diagram of control signals S1 to S4 generated by a clock generating circuit according to the second embodiment of the present disclosure.

The clock generating circuit 140 generates clocks S1 to S4 (control signals) from a reference frequency signal ($f_{REF}$) output from a reference frequency oscillator (not shown) and supplies the control signals S1 to S4 to the charge inverting circuit 130. A timing diagram of the control signals S1 to S4 generated by the clock generating circuit 140 is shown in FIG. 7. The control signals S1 to S4 each have a pulse width $T_s$ and a control signal period $T_{CK}$. The pulse width $T_s$ is equal to a sampling interval. Note that although FIG. 7 shows a rectangular clock, the charge inverting circuit 130 operates even on a clock with a blunt waveform. In FIG. 7, the clock generating circuit 140 supplies the four-phase control signals S1, S2, S3, and S4 that have a duty ratio (=the pulse width $T_s$/the control signal period $T_{CK}$) of 0.25 and are 90° out of phase with each other to the charge inverting circuit 130.

The charge inverting circuit 130 includes two capacitances 131-1 and 131-2 and eight switches 132-1 to 132-8 which control connection of the two capacitances 131-1 and 131-2. The charge inverting circuit 130 has the terminals A and B at two ends. In the CT/DT hybrid circuit 100, either one of the terminals A and B of the charge inverting circuit 130 is connected to the output terminal T-TA$_{out}$ of the TA 110, and the other is connected to GND. An example in which the terminal A of the charge inverting circuit 130 is connected to the output terminal T-TA$_{out}$ of the TA 110 will be described below.

The capacitance 131-1 has a terminal X1 and a terminal Y1, and the capacitance 131-2 has a terminal X2 and a terminal Y2. The capacitances 131-1 and 131-2 are provided in parallel with each other. The capacitances 131-1 and 131-2 have a capacitance value $C_R$.

The switch 132-1 controls connection between the terminal X1 and the terminal A by the control signal S1, and connects the terminal X1 to the terminal A during a period when the control signal S1 is high and disconnects the terminal X1 from the terminal A during a period when the control signal S1 is low. The switch 132-2 controls connection between the terminal Y1 and the terminal B by the control signal S1, and connects the terminal Y1 to the terminal B during a period when the control signal S1 is high and disconnects the terminal Y1 from the terminal B during a period when the control signal S1 is low. The switch 132-3 controls connection between the terminal X2 and the terminal A by the control signal S2, and connects the terminal X2 to the terminal A during a period when the control signal S2 is high and disconnects the terminal X2 from the terminal A during a period when the control signal S2 is low. The switch 132-4 controls connection between the terminal Y2 and the terminal B by the control signal S2, and connects the terminal Y2 to the terminal B during a period when the control signal S2 is high and disconnects the terminal Y2 from the terminal B during a period when the control signal S2 is low. The switch 132-5 controls connection between the terminal X1 and the terminal B by the control signal S3, and connects the terminal X1 to the terminal B during a period when the control signal S3 is high and disconnects the terminal X1 from the terminal B during a period when the control signal S3 is low. The switch 132-6 controls connection between the terminal Y1 and the terminal A by the control signal S3, and connects the terminal Y1 to the terminal A during a period when the control signal S3 is high and disconnects the terminal Y1 from the terminal A during a period when the control signal S3 is low. The switch 132-7 controls connection between the terminal X2 and the terminal B by the control signal S4, and connects the terminal X2 to the terminal B during a period when the control signal S4 is high and disconnects the terminal X2 from the terminal B during a period when the control signal S4 is low. The switch 132-8 controls connection between the terminal Y2 and the terminal A by the control signal S4, and connects the terminal Y2 to the terminal A during a period when the control signal S4 is high and disconnects the terminal Y2 from the terminal A during a period when the control signal S4 is low.

<Operation of CT/DT Hybrid Circuit>

Operation of the CT/DT hybrid circuit 100 will be described.

The CT/DT hybrid circuit 100 repeatedly performs charge sharing at intervals of $T_s$ and generates a sample value. The CT/DT hybrid circuit 100 performs the two types of operations below in parallel.

(Operation 1-a) The TA 110 accumulates charge obtained through conversion of the input voltage signal $V_{in}$ into current, that is, charge (hereinafter referred to as input charge) output to the output terminal T-TA$_{out}$ of the TA 110 in the capacitance 120 and the capacitances 131-1 and 131-2.

(Operation 1-b) The capacitance 120 and the capacitance 131-1 or the capacitance 120 and the capacitance 131-2 share charge.

Note that the charge inverting circuit 130 performs charge sharing by inverting the polarity of charge accumulated earlier by a period of $2T_s$ and held by the charge inverting circuit 130.

The charge inverting circuit 130 performs the four operations below during one cycle ($T_{CK}$) by controlling (turning on or off) the switches 132-1 to 132-8 on the basis of the control signals S1 to S4 shown in FIG. 7 and repeats the operations at intervals of $T_{CK}$.

First operation: During a period when the control signal S1 is high, the terminal X1 of the capacitance 131-1 is connected to the terminal A, and the terminal Y1 is connected to the terminal B (hereinafter referred to as positive-phase connection of the capacitance 131-1).

Second operation: During a period when the control signal S2 is high, the terminal X2 of the capacitance 131-2 is connected to the terminal A, and the terminal Y2 is connected to the terminal B (hereinafter referred to as positive-phase connection of the capacitance 131-2).

Third operation: During a period when the control signal S3 is high, the terminal Y1 of the capacitance 131-1 is connected to the terminal A, and the terminal X1 is connected to the terminal B (hereinafter referred to as negative-phase connection of the capacitance 131-1).

Fourth operation: During a period when the control signal S4 is high, the terminal Y2 of the capacitance 131-2 is connected to the terminal A, and the terminal X2 is connected to the terminal B (hereinafter referred to as negative-phase connection of the capacitance 131-2).

That is, the four operations, the first operation, the second operation, the third operation, and the fourth operation are performed at intervals of $T_s$. In the first operation, the capacitance 131-1 is connected in positive phase, and the capacitance 131-2 holds charge shared through negative-phase connection. In the second operation, the capacitance 131-2 is connected in positive phase, and the capacitance 131-1 holds charge shared through positive-phase connection. In the third operation, the capacitance 131-1 is connected in negative phase, and the capacitance 131-2 holds charge shared through positive-connection. In the fourth operation, the capacitance 131-2 is connected in negative phase, and the capacitance 131-1 holds charge shared through negative-phase connection.

The capacitances 131-1 and 131-2 connects, in negative phase (positive phase), charge shared through positive-phase connection (negative-phase connection), thereby performing an operation of inverting the polarity of held charge and making a connection.

That is, through the first to fourth operations, the charge inverting circuit 130 repeatedly alternates, at intervals of $T_s$, an operation (the first operation or the third operation) in which the capacitance 131-1 is connected while the polarity of held charge is inverted, and connection of the capacitance 131-2 is released to hold charge and an operation (the second operation or the fourth operation) in which the capacitance 131-2 is connected while the polarity of held charge is inverted, and connection of the capacitance 131-1 is released to hold charge.

A circuit transfer function $H_{CD}$ achieved by the above-described configuration is given by Expression (1):

$$H_{CD} = \left\{1 - \frac{K'(1-z^{-1})(1+z^{-1})}{j\omega T_S D}\right\} H_C \qquad (1)$$

$$H_C = \frac{g_m}{j\omega(C_H + C_R)}$$

$$D = 1 - Kz^{-1} + K'z^{-2}$$

$$K = \frac{C_H}{C_H + C_R}$$

$$K' = \frac{C_R}{C_H + C_R}$$

A DC gain can be described by Expression (2). The gain can be controlled by the transconductance value $g_m$ of the voltage-to-current conversion circuit, capacitance ratios K and K', capacitance values, and a clock frequency.

$$H_{CD}(0) = \frac{g_m K}{2K'(C_H + C_R)f_S} \qquad (2)$$

The width of a band with a flat gain for flat characteristic implementation is given by Expression (3):

$$f_{BW} = \frac{C_R}{\pi C_H} f_S = \frac{C_R}{4\pi C_H} f_{CLK} \qquad (3)$$

The bandwidth is determined by a capacitance ratio and a clock frequency.

<Frequency Characteristic of CT/DT Hybrid Circuit>

Figure 8B:
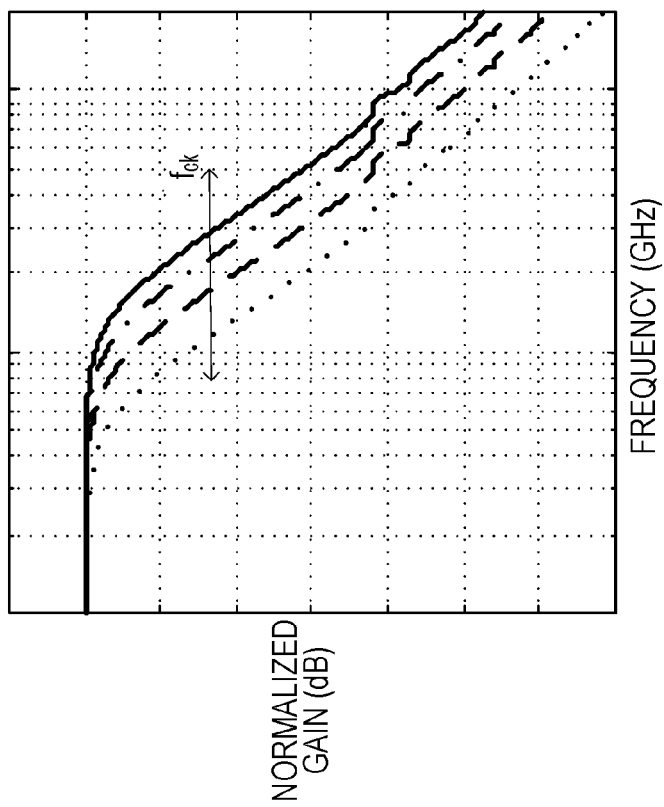
FIG. 8B is a graph showing a result of a circuit simulation of a frequency characteristic which changes in response to a change in a clock frequency $f_{ck}$ of the low-pass characteristics of the CT/DT hybrid circuit according to the second embodiment of the present disclosure.
Figure 8A:
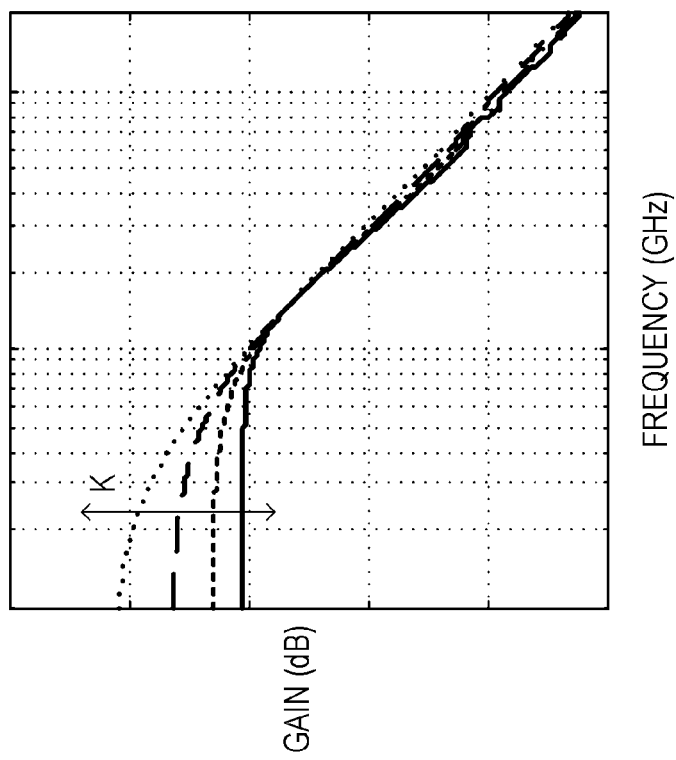
FIG. 8A is a graph showing a result of a circuit simulation of a frequency characteristic which changes in response to a change in a capacitance ratio K of low-pass characteristics of the CT/DT hybrid circuit according to the second embodiment of the present disclosure.

A frequency characteristic of the CT/DT hybrid circuit 100 will be described. FIG. 8A is a graph showing a result of a circuit simulation of a frequency characteristic which changes in response to a change in the capacitance ratio K of low-pass characteristics of the CT/DT hybrid circuit 100. FIG. 8B is a graph showing a result of a circuit simulation of a frequency characteristic which changes in response to a change in a clock frequency $f_{ck}$ of the low-pass characteristics of the CT/DT hybrid circuit 100. The abscissa in each of FIGS. 8A and 8B indicates frequency while the ordinate indicates gain. FIGS. 8A and 8B show low-pass characteristics of the CT/DT hybrid circuit 100 which change with the capacitance ratio K and the clock frequency $f_{ck}$ as parameters.

As can be seen from FIGS. 8A and 8B, the CT/DT hybrid circuit 100 is a circuit through which a broadband signal can pass and can adjust an in-band deviation (a level difference) of a passband and the width of the passband by changing a capacitance ratio or a clock frequency.

Since the CT/DT hybrid circuit 100 can adjust a gain by adjusting the values $g_m$, $C_H$, and $C_R$, the CT/DT hybrid circuit 100 can also be used as a variable gain amplifier (VGA). An amplifier may be connected to an input or an output of the TA 110 to increase a gain.

Note that the CT/DT hybrid circuit 100 can easily change a characteristic by making the capacitance 120 (the capacitance value $C_H$) and the capacitances 131-1 and 131-2 (the capacitance value $C_R$) variable capacitance and can adaptively change a characteristic so as to cope with effects of a communication environment (for example, a change in ambient temperature or power supply voltage) or variation between circuit elements.

Examples of a method for constructing a variable capacitance include a method that controls the number of capacitances to be connected using switches and a method that controls a value of a voltage to be applied to a varactor capacitance using a voltage and changes a capacitance value. The same applies to the subsequent embodiments.

Note that a method that performs monitoring by connecting a buffer, such as a voltage-controlled voltage source (VCVS) which minimizes movement of held charge, or an amplifier may be used as a method for monitoring the output terminal T-$V_{out}$.

The CT/DT hybrid circuit 100 may be configured so as not to include the capacitance 120 (the capacitance value $C_H$).

<Method for Implementing CT/DT Hybrid Circuit>

Figure 9:
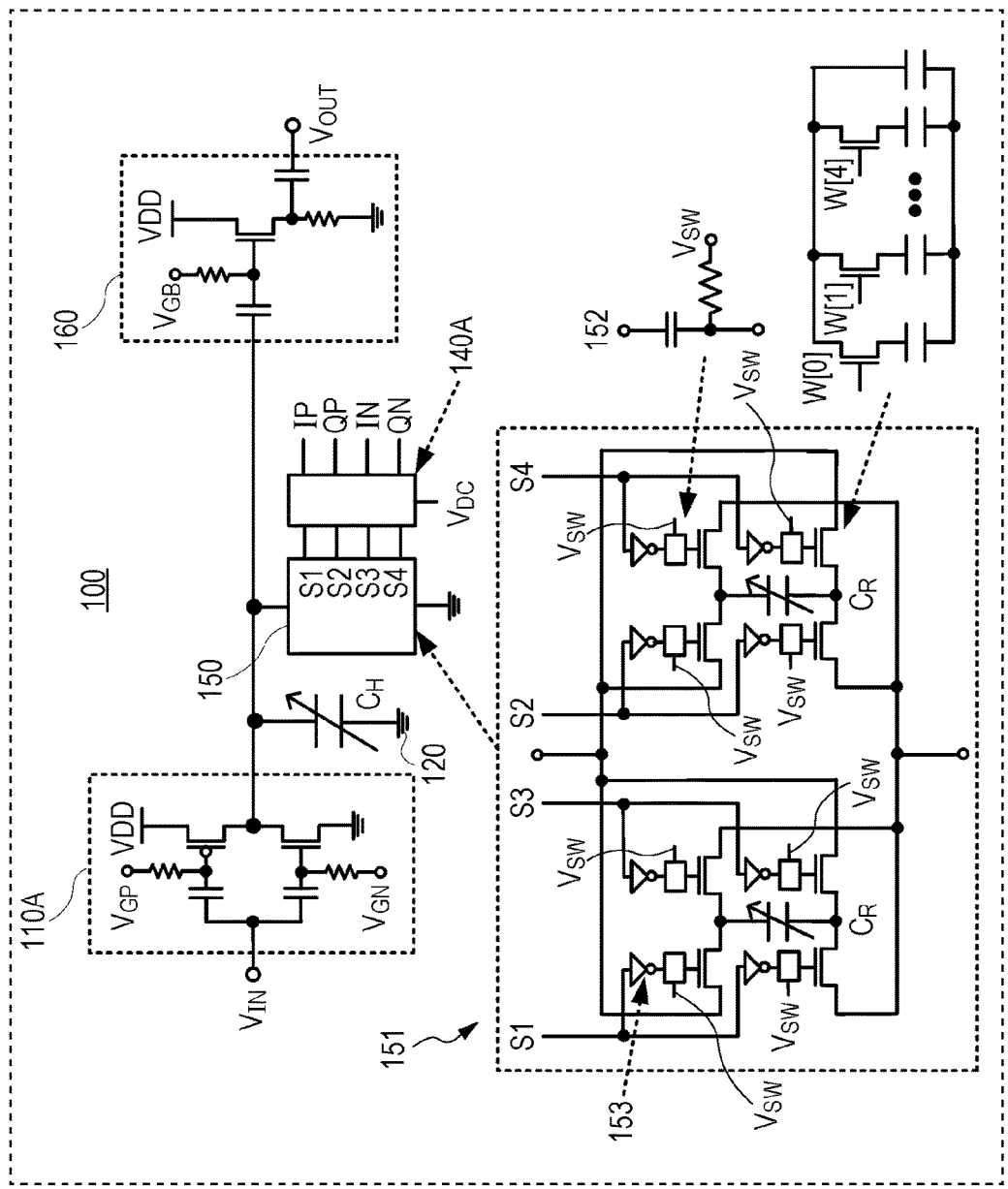
FIG. 9 is a diagram showing an example of a CMOS-based method for implementing the CT/DT hybrid circuit according to the second embodiment of the present disclosure.

FIG. 9 shows an example of a CMOS-based method for implementing the CT/DT hybrid circuit 100. The CT/DT hybrid circuit 100 shown in FIG. 9 includes a TA 110A, the capacitance 120, a switch 150, a clock generating circuit 140A, and an output buffer 160. The TA 110A is composed of an inverter type amplifier. The switch 150 is constructed using an NMOS transistor. The output buffer 160 is constructed using a source follower. Note that the switch 150 may be constructed using a PMOS transistor or constructed as a complementary switch using an NMOS and a PMOS (see, for example, Behzad Razavi, "Design of Analog CMOS Integrated Circuits", 12.2.2 Speed Considerations, pp. 504-508, Mar. 30, 2003).

In FIG. 9, eight switch bias adjusting circuits 152 are connected to an input of the switch 150 in a discrete circuit block 151 such that a clock DC potential and a switch bias potential are separate. An inverter circuit 153 is connected to an input of the switch bias adjusting circuit 152. The number of inverter circuits 153 is arbitrary and that the inverter circuit 153 may be omitted.

Figure 10B:
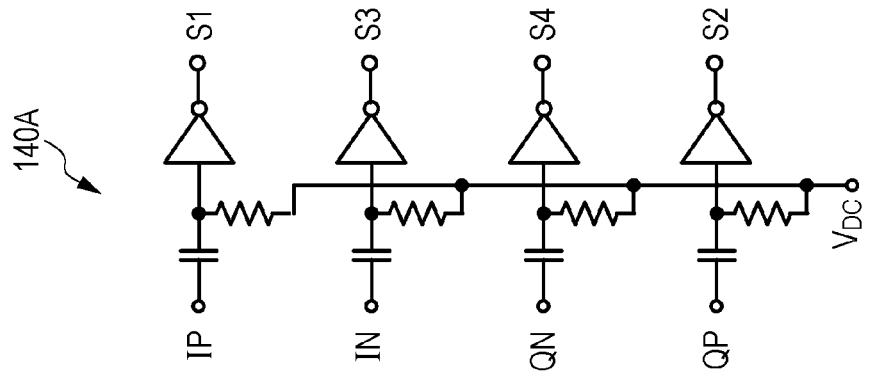
FIG. 10B is a diagram showing an example of the configuration of the clock generating circuit in FIG. 9.
Figure 10A:
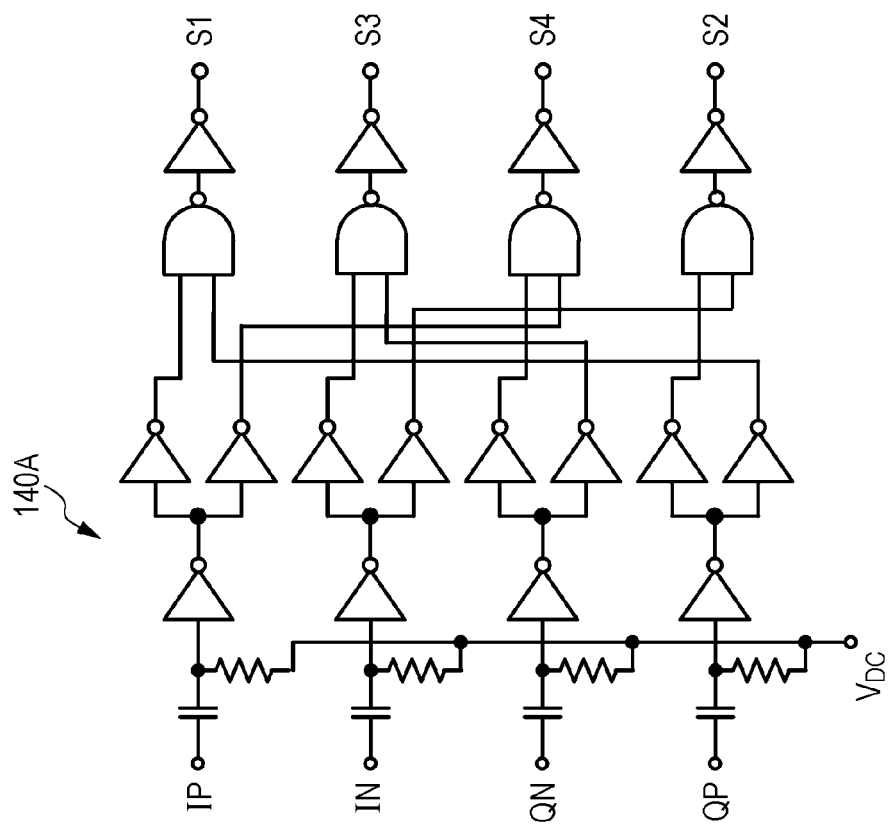
FIG. 10A is a diagram showing an example of the configuration of a clock generating circuit in FIG. 9.
Figure 11:
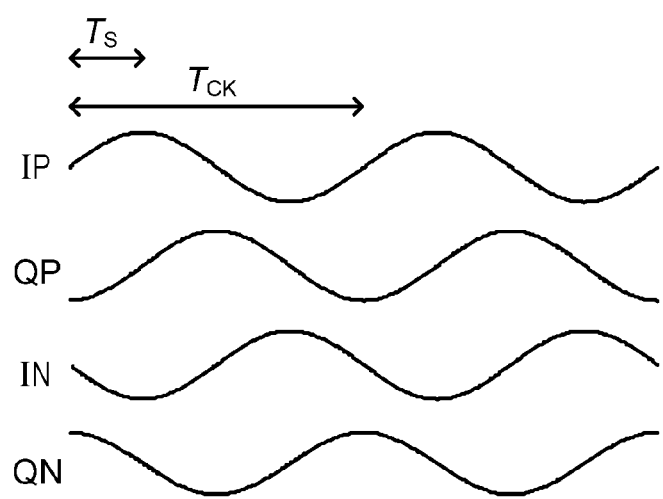
FIG. 11 is a diagram showing sinusoidal waves input to the clock generating circuit in FIG. 9.

FIGS. 10A and 10B show examples of the configuration of the clock generating circuit 140A in FIG. 9. Four-phase sinusoidal waves 90° out of phase in FIG. 11 are input to each of the clock generating circuits 140A in FIGS. 10A and 10B.

FIG. 10A shows a configuration in which an input sinusoidal wave is adjusted in bias and is input to an inverter and a NAND, and FIG. 10B shows a configuration in which an input sinusoidal wave is adjusted in bias and is input to an inverter. Both the configurations implement the same function as the clock with the duty ratio of 25%.

Duty ratios of the clocks S1 to S4 in FIG. 9 can be adjusted by a clock bias $V_{DC}$ in FIG. 10A or 10B. A gate bias voltage of an NMOS switch in the discrete circuit block can be controlled by $V_{SW}$ in FIG. 9 and can be controlled separately from duty ratio adjustment.

Figure 12:
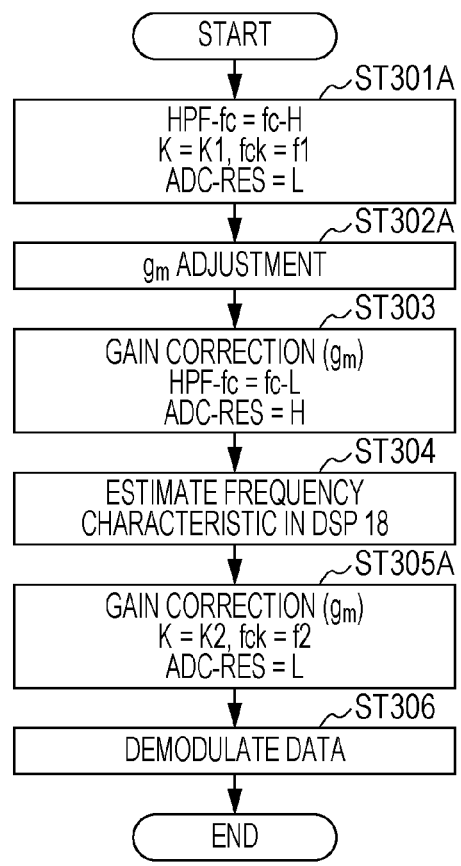
FIG. 12 is a flowchart showing the flow of control in a radio receiving device according to the second embodiment of the present disclosure.

FIG. 12 shows a control flow for a radio receiving device (not shown) in a case using the CT/DT hybrid circuit 100 as the AEQ/VGA 15. Note that the same steps as those in FIG. 5 are denoted by the same reference characters in the control flow shown in FIG. 12.

Adjustment of a frequency characteristic AEQ-F of the AEQ/VGA 15 that is performed in ST301 and ST305 in FIG. 5 is performed using the capacitance ratio K and the clock frequency $f_{ck}$ in ST301A and ST305A in FIG. 12.

More specifically, in ST301A, the radio receiving device 1 sets the capacitance ratio K of the CT/DT hybrid circuit 100 to K1 and sets the clock frequency $f_{ck}$ to f1. In ST305A, the radio receiving device 1 sets the capacitance ratio K of the CT/DT hybrid circuit 100 to K2 and the clock frequency $f_{ck}$ to f2.

Note that values of K1 and f1 are arbitrary. For example, if a plurality of test signals with the same amplitude which range from a low frequency to a high frequency in a signal band for a system to be used are input, frequency characteristics in the signal band may be flat at an input of the ADC 17. Values of K2 and f2 may be set to values which curb increase in a deviation in the signal band due to a frequency characteristic of a radio circuit and a frequency characteristic of a propagation path at the input of the ADC 17 in response to a result of frequency characteristic estimation in ST304. Note that the values of K2 and f2 may be different from those of K1 and f1, respectively.

Gain adjustment of the AEQ/VGA 15 that is performed in ST302 in FIG. 5 is performed through $g_m$ adjustment in FIG. 12.

Note that, in a system which changes a bandwidth to suit the situation, like channel bonding used in IEEE 802.11ay, a bandwidth for the CT/DT hybrid circuit 100 and a reference clock of the ADC 17 are shared and that a frequency of the reference clock is changed in response to change of the bandwidth. This allows change of bandwidths for the AEQ/VGA 15 and the ADC 17. It is thus possible to simplify configuration and reduce power consumption.

Third Embodiment

A third embodiment will describe a case where a frequency characteristic of a transmitting and receiving device is corrected through adjustment at the time of factory shipment.

<Configuration of Transmitting and Receiving Device>

Figure 13:
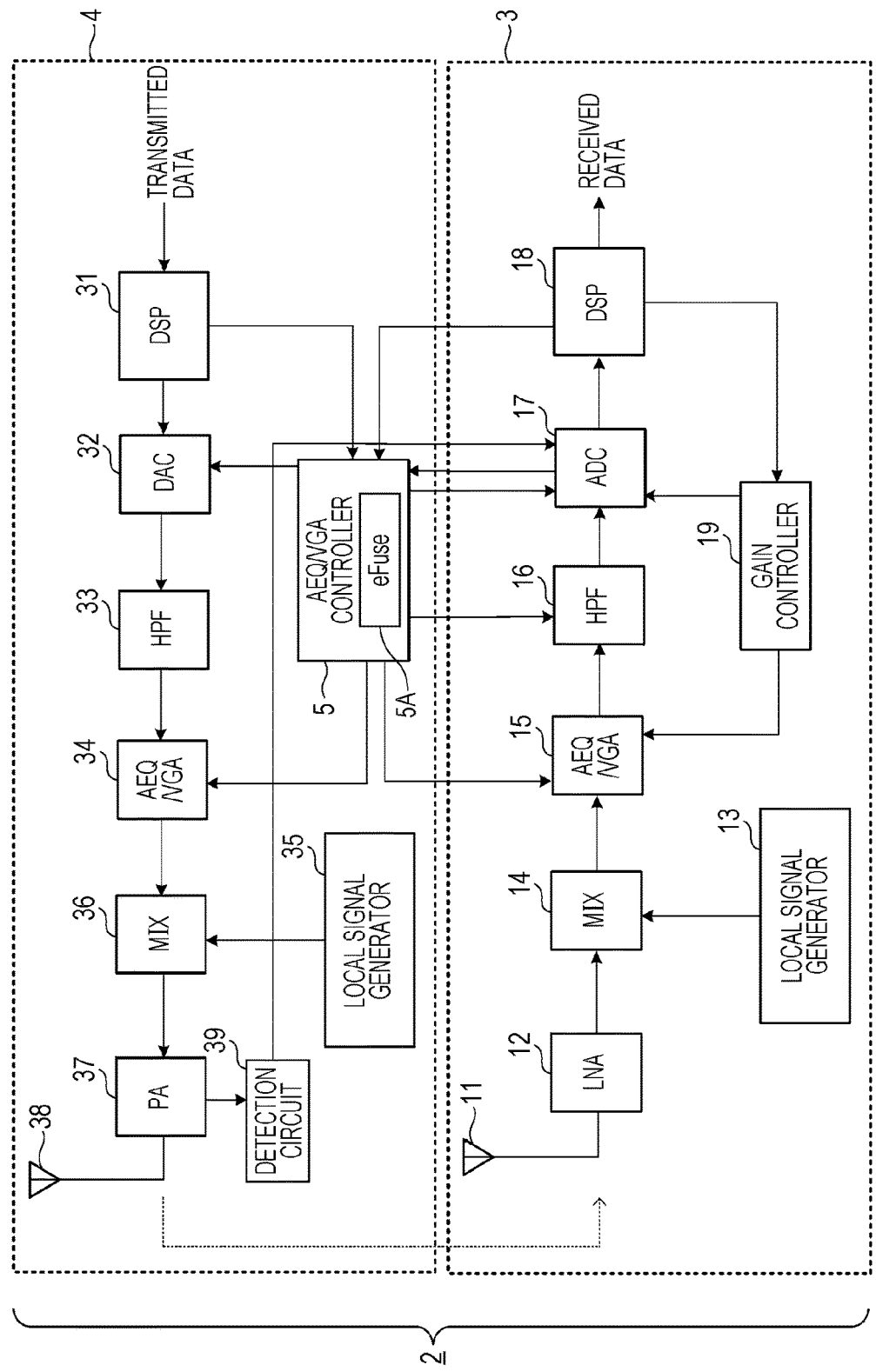
FIG. 13 is a block diagram showing an example of the configuration of a transmitting and receiving device according to a third embodiment of the present disclosure.

FIG. 13 is a block diagram showing the configuration of a transmitting and receiving device 2 according to the present embodiment. Note that the same components as those in the radio receiving device 1 shown in FIG. 1 are denoted by the same reference characters as those in FIG. 1 in the transmitting and receiving device 2 shown in FIG. 13 and that a description thereof will be omitted.

The transmitting and receiving device 2 shown in FIG. 13 includes a receiver 3, a transmitter 4, and an AEQ/VGA controller 5. The receiver 3 includes a receiving antenna 11, an LNA 12, a local signal generator 13, a MIX 14, an AEQ/VGA 15, an HPF 16, an ADC 17, a DSP 18, and a gain controller 19. The transmitter 4 includes a DSP 31, a digital/analog converter (DAC) 32, an HPF 33, an AEQ/VGA 34, a local signal generator 35, a MIX 36, a power amplifier (PA) 37, a transmitting antenna 38, and a detection circuit 39.

The DSP 31 modulates transmitted data by performing digital signal processing on the transmitted data in accordance with a predetermined modulation scheme and outputs the transmitted data to the DAC 32. The DSP 31 also outputs test signals of several frequencies to the AEQ/VGA controller 5.

The DAC 32 converts the digital transmitted signal output from the DSP 31 into an analog transmitted signal on the basis of a number of bits code output from the AEQ/VGA controller 5 and outputs the analog transmitted signal to the HPF 33.

The HPF 33 sets a cutoff frequency, cuts off a transmitted signal in a band below the cutoff frequency of the transmitted signals output from the DAC 32, and outputs a transmitted signal left after the cutoff to the AEQ/VGA 34.

The AEQ/VGA 34 performs an analog equalization process of correcting a frequency characteristic in the transmitted signal output from the HPF 33 on the basis of a frequency characteristic code output from the AEQ/VGA controller 5 and shapes a waveform of the transmitted signal. The AEQ/VGA 34 outputs the transmitted signal after the amplification process and the analog equalization process to the MIX 36.

The local signal generator 35 generates a local signal for upconversion in the MIX 36 and supplies the local signal to the MIX 36.

The MIX 36 upconverts the baseband transmitted signal output from the AEQ/VGA 34 using the local signal supplied from the local signal generator 35 to generate a millimeter-wave transmitted signal and outputs the millimeter-wave transmitted signal to the PA 37.

The PA 37 amplifies the millimeter-wave transmitted signal output from the MIX 36 and outputs the millimeter-wave transmitted signal to the transmitting antenna 38.

The transmitting antenna 38 transmits the millimeter-wave transmitted signal output from the PA 37 by radio. Note that the transmitting antenna 38 may be composed of a plurality of antenna elements.

The detection circuit 39 detects a gain and a frequency characteristic from an output from the PA 37. For example, the detection circuit 39 may be configured to multiply an output signal from the PA 37 by 0.1 over a signal band using a coupler or may be a circuit which detects an amplitude, such as a square-law detection circuit. If a circuit which detects an amplitude is used, the detection circuit 39 detects a frequency characteristic of the PA 37 using test signals of a plurality of frequencies. The detection circuit 39 outputs the detected gain and frequency characteristic to the ADC 17.

Figure 14:
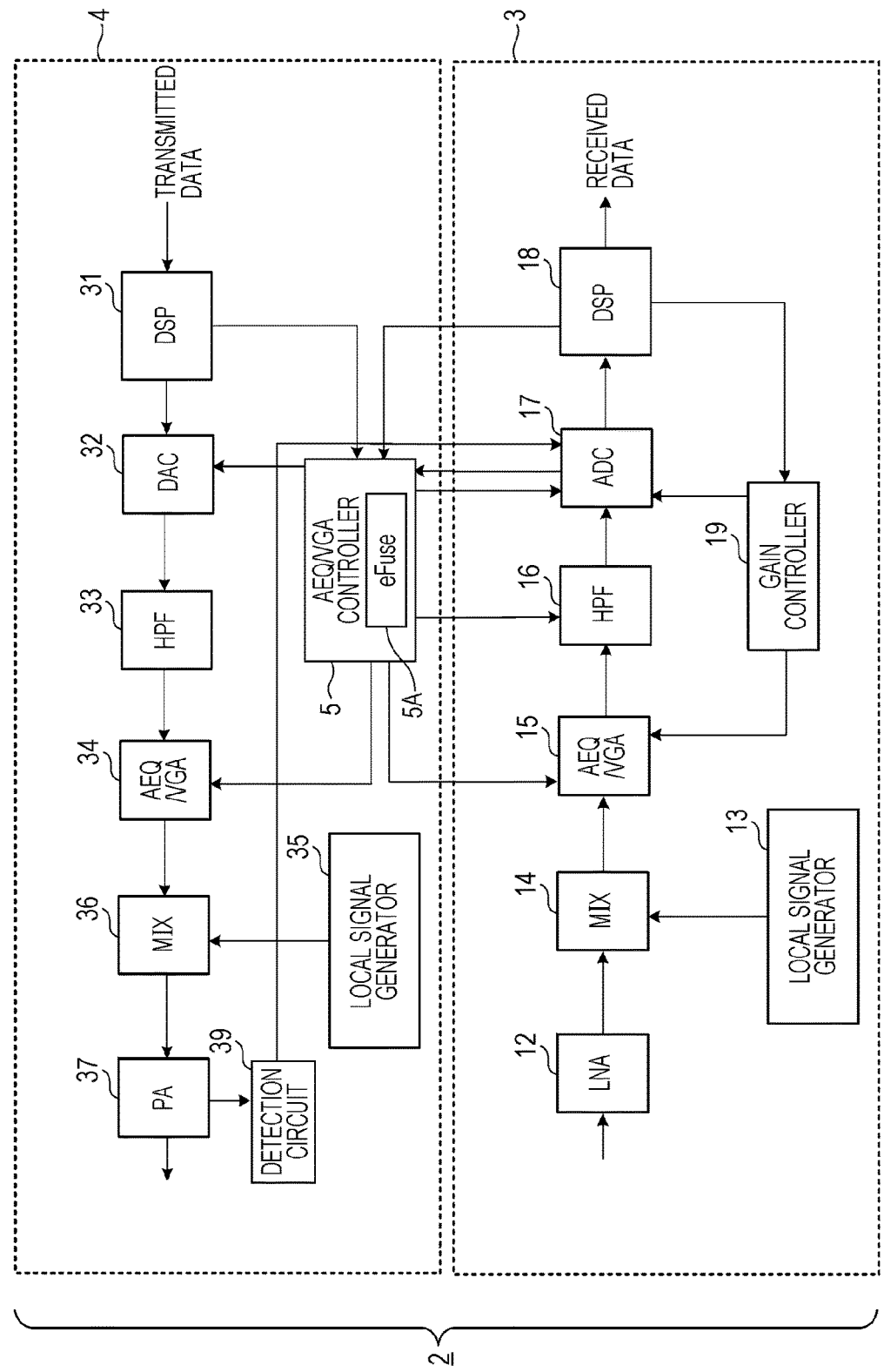
FIG. 14 is a block diagram showing another example of the configuration of the transmitting and receiving device according to the third embodiment of the present disclosure.

Note that although the transmitting and receiving device 2 includes the receiving antenna 11 and the transmitting antenna 38 in FIG. 13, the present embodiment is not limited to this. As shown in FIG. 14, the transmitting and receiving device 2 may be configured so as not to include the receiving antenna 11 and the transmitting antenna 38 and may use external antennas.

<Processing at Time of Inspection Before Factory Shipment>

In the present embodiment, the transmitting and receiving device 2 performs the processing below, for example, in probe inspection before factory shipment.

The DSP 31 of the transmitter 4 outputs test signals of several frequencies to the AEQ/VGA controller 5.

Each time a test signal is output, a signal output from the detection circuit 39 is converted into a digital signal in the ADC 17 and is input to the AEQ/VGA controller 5. The AEQ/VGA controller 5 estimates a frequency characteristic of the transmitter 4 from an input value and outputs a frequency characteristic code indicating a frequency characteristic which is an inverse of the frequency characteristic to the AEQ/VGA 34.

A test signal output from the DSP 31 of the transmitter 4 is input to the LNA 12 of the receiver 3 through the PA 37 of the transmitter 4, as indicated by a dotted line in FIG. 13, and is finally input to the DSP 18 of the receiver 3. At this time, a leak signal from the PA 37 to the LNA 12 may be used as a signal to be input to the receiver 3 or a signal path from the PA 37 to the LNA 12 may be intentionally prepared by probing or switching. The DSP 18 of the receiver 3 outputs a reception result to the AEQ/VGA controller 5. The AEQ/VGA controller 5 estimates a frequency characteristic of the receiver 3 from received data and outputs a frequency characteristic code indicating a frequency characteristic which is an inverse of the frequency characteristic to the AEQ/VGA 15.

The AEQ/VGA controller 5 writes setup values for frequency characteristics of the receiver 3 and the transmitter 4 in an internal eFuse 5A.

Note that the transmitter 4 may perform gain adjustment of the I/Q differential AEQ/VGA 34 to perform carrier leak and image leak adjustment.

Note that a configuration in which the ADC 17 of the receiver 3 is used even at a test on the transmitter 4 is illustrated in the present embodiment, a number of bits for the ADC 17 may be lowered at a test or the ADC 17 for testing may be separately prepared.

Note that setup values for a frequency characteristic and a gain of each of the AEQ/VGAs 15 and 34 after frequency characteristic estimation are not limited to values, at which the frequency characteristic is an inverse of an estimated value, and may be values which reduce fluctuations in a frequency characteristic as an estimated value.

Although the gain controller 19 is connected to the AEQ/VGA 15 and the ADC 17 of the receiver 3 in FIGS. 13 and 14, the gain controller 19 may be connected to the HPF 16 of the receiver 3 and the AEQ/VGA 34 and the HPF 33 of the transmitter 4 to perform gain control of the AEQ/VGA 34 and cutoff frequency control of the HPF 16 and the HPF 33. Note that the gain controller 19 and the AEQ/VGA controller 5 may be integrated into one piece. Locations where the AEQ/VGAs 15 and 34 and the HPFs 16 and 33 are arranged and the numbers of AEQ/VGAs 15 and 34 and HPFs 16 and 33 may be configured in the same manner as in the first embodiment.

Although the embodiments have been described above with reference to the drawings, the present disclosure is not limited to the examples. It is apparent to those skilled in the art that various changes or modifications can be made within the scope of the claims, and such changes and modifications are understood to fall within the technical scope of the present disclosure.

For example, each of the above-described embodiments has described a case where a frequency characteristic of a device used for millimeter-wave communication is corrected by an analog equalizer. The present disclosure, however, is not limited to this. In non-orthogonal multiple access (NOMA) under consideration in cellular communication, a power consumption reduction effect can be achieved by switching the number of bits of the ADC 17. This respect will be described below.

Since a terminal for cellular communication recognizes both a signal to be received by the terminal as a terminal close to a base station and a signal to be received by the terminal as a terminal remote from the base station, a larger number of bits is used in the ADC 17.

If the terminal is a terminal remote from the base station, a signal addressed to a different terminal close to the base station is sufficiently smaller than a signal addressed to the terminal that is a terminal remote from the base station. The ADC 17 can skip recognition of the signal addressed to the different terminal close to the base station. For this reason, the number of bits can be lowered to suit recognition of a signal addressed to the terminal that is a terminal remote from the base station.

Use of a different number of bits for the ADC 17 in accordance with a distance from a base station to a terminal allows reduction in unnecessary power consumption. An example of measures by which a terminal knows a distance from a base station is conveyance of position information to the terminal by the base station.

In a case where a terminal close to a base station provides a period for demodulation of a signal which is transmitted to a terminal remote from the base station as, for example, a disturbing wave for cancelling separately from a reception period for demodulation of a signal addressed to the terminal, the terminal close to the base station can reduce power consumption of the terminal close to the base station by lowering the number of bits of the ADC 17 during the period for disturbing wave demodulation.

Fourth Embodiment

The present embodiment will describe an activation procedure for a radio receiving device 1 shown in FIGS. 1, 2, and 3 to operate in conformity with IEEE 802.11ay.

Figure 15A:
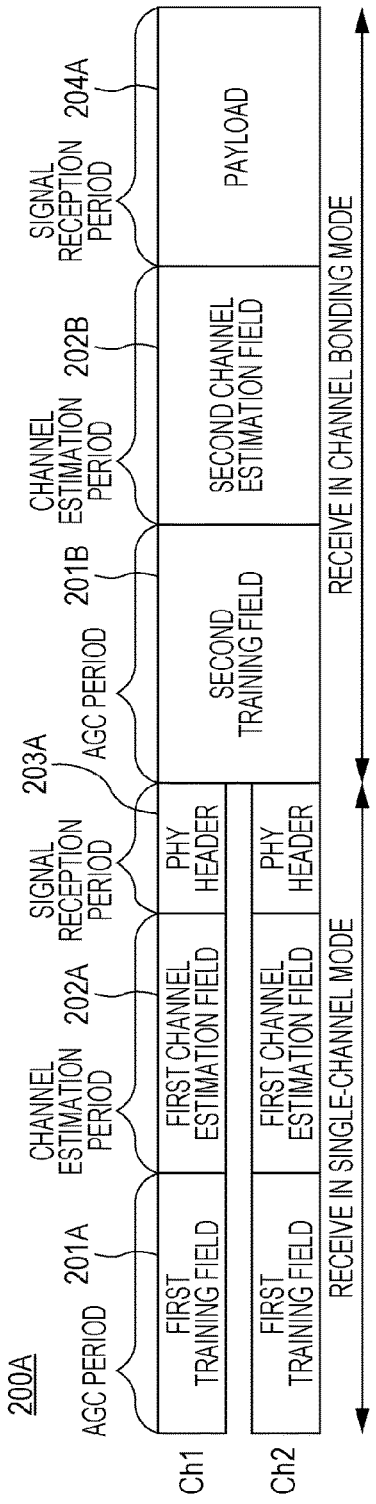
FIG. 15A is a diagram showing a frame format for IEEE 802.11ay according to a fourth embodiment of the present disclosure.

FIG. 15A shows a frame format for IEEE 802.11ay.

In IEEE 802.11ay, the radio receiving device 1 performs reception in single-channel mode over periods for a first training field (a first STF) 201A, a first channel estimation field (a first CEF) 202A, and a PHY header 203A and performs reception in channel bonding mode over periods for a second training field (a second STF) 201B, a second channel estimation field (a second CEF) 202B, and a payload (data) 204A.

Figure 15B:
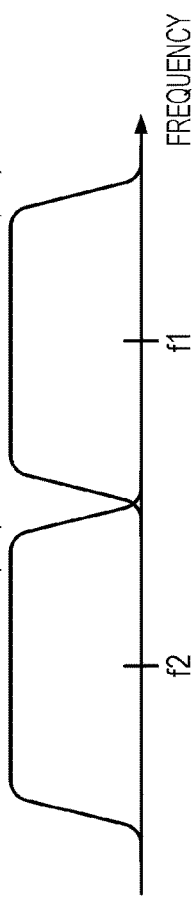
FIG. 15B is a diagram showing a conception of a modulated wave spectrum in single-channel mode according to the fourth embodiment of the present disclosure.
Figure 15C:
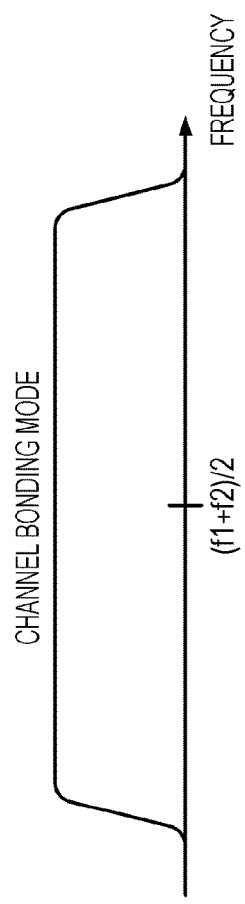
FIG. 15C is a diagram showing a conception of a modulated wave spectrum in channel bonding mode according to the fourth embodiment of the present disclosure.

FIG. 15B shows a conception of a modulated wave spectrum in single-channel mode. FIG. 15C shows a conception of a modulated wave spectrum in channel bonding mode.

A receiving device receives a modulated wave signal in one broad band, into which a plurality of channels are bonded, in channel bonding mode.

Note that FIG. 15A shows a frame configuration in the case of two-channel bonding in IEEE 802.11ay. Three-channel bonding or four-channel bonding is different in that the number of channels which receive in single-channel mode is 1, 2, 3, or 4 and that the number of channels bonded which receive in channel bonding mode is 3 or 4. Three-channel bonding or four-channel bonding, however, is the same as two-channel bonding in the configuration of a receiving device and control flow, and a description thereof will be omitted.

(Control Flow)

Figure 16A:
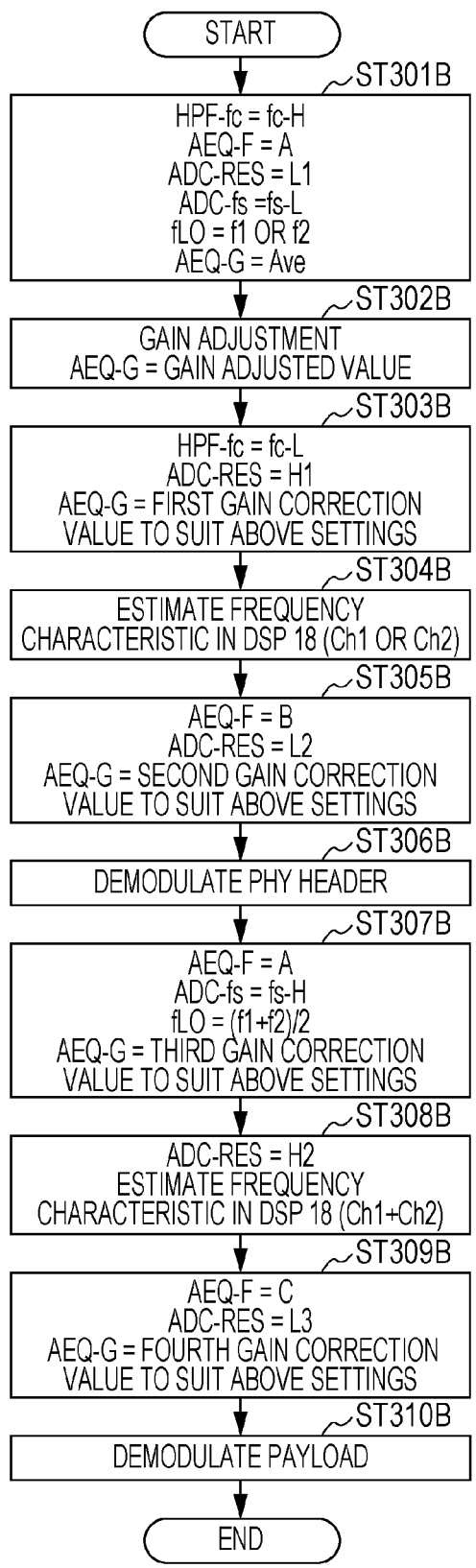
FIG. 16A is a flowchart showing gain adjustment and frequency characteristic and number of bits control in a radio receiving device by the radio receiving device after receipt of the frame format according to the fourth embodiment of the present disclosure.

FIG. 16A is a flowchart showing gain adjustment and frequency characteristic and number of bits control in the radio receiving device 1 by the radio receiving device 1 shown in FIGS. 1 to 3 after receipt of a frame format 200A shown in FIG. 15A.

Figure 16B:
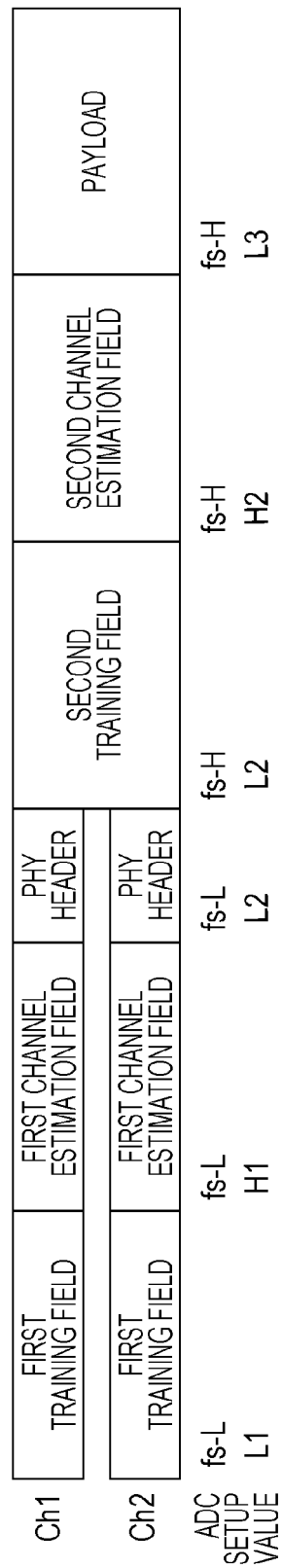
FIG. 16B is a diagram showing ADC setup values for the frame format according to the fourth embodiment of the present disclosure.

FIG. 16B shows ADC setup values for the frame format 200A. Power consumption of an ADC is reduced by making the total of sections with a sampling frequency of fs-L and a number of bits of L (smaller than H) as long as possible.

(Reception in Single-Channel Mode)

In ST301B, an AGC period (201A or 201B) is short in communication using a millimeter-wave band, and an AGC settling time is desirably about 600 ns. For this reason, a cutoff frequency fc of an HPF 16 is set to several hundreds of MHz. Thus, the radio receiving device 1 sets a cutoff frequency HPF-fc of the HPF 16 to a first cutoff frequency value fc-H at the start of an AGC period (at the start of the first training field 201A or before reception).

Since reception is performed in single-channel mode in a first half of the frame format 200A, a sampling frequency ADC-fs of the ADC 17 is set to the value fs-L adapted for single-channel demodulation. A frequency (f1 or f2) of a local signal generator 13 is adapted to a channel which is known in advance from a control packet and is to be used in the first half of the frame format 200A.

The radio receiving device 1 sets a frequency characteristic AEQ-F in a signal output from an AEQ/VGA 15 to a value A at which the frequency characteristic AEQ-F is flat in a signal band and sets a number of bits ADC-RES of the ADC 17 to a first number of bits L1.

The radio receiving device 1 also sets a gain AEQ-G of the AEQ/VGA 15 to a standard value Ave.

Here, fc-H is a cutoff frequency value at which the AGC settling time is about 600 ns, and L1 is a number of bits less than a number of bits required for channel (frequency characteristic) estimation but sufficient for AGC.

In ST302B, if the first training field 201A is received, the gain controller 19 performs gain adjustment of the AEQ/VGA 15. For example, the gain controller 19 repeats adjustment of the setting of the gain AEQ-G of the AEQ/VGA 15 on the basis of whether the level of a received signal output from the ADC 17 exceeds a threshold. The gain controller 19 first performs coarse adjustment by binary search and then performs fine adjustment by linear search.

In ST303B, after completion of the adjustment of the gain AEQ-G of the AEQ/VGA 15 (a gain adjusted value), the gain controller 19 sets the cutoff frequency HPF-fc of the HPF 16 to a second cutoff frequency value fc-L to avoid deterioration of communication quality at the time of data demodulation. Since an amplitude of a received signal changes with the change of the cutoff frequency of the HPF 16, the gain controller 19 corrects the gain AEQ-G of the AEQ/VGA 15 so as to cancel out the change in amplitude (a first gain correction value).

The above-described correction allows prevention of rise in an error rate for a received signal. Note that the first gain correction value is estimated in advance. The gain controller 19 sets the number of bits ADC-RES of the ADC 17 to a second number of bits H1 to estimate a frequency characteristic of a radio circuit and a frequency characteristic of a propagation path with high accuracy. Here, fc-L is a cutoff frequency value at which deterioration of the accuracy of demodulation of a received signal by a HPF 16 can be reduced to an allowable level, and the second number of bits H1 is a number of bits sufficient for channel (frequency characteristic) estimation in single-channel mode.

In ST304B, if the first channel estimation field 202A is received in the state set in ST303B, the DSP 18 estimates the frequency characteristic (Ch1 or Ch2) of the radio circuit and the propagation path on the basis of a received signal output from the ADC 17.

In ST305B, an AEQ/VGA controller 20 sets the frequency characteristic AEQ-F of the AEQ/VGA 15 to B such that the frequency characteristic AEQ-F is an inverse of an estimated value from the DSP 18. Since an amplitude of a received signal changes with the change of the frequency characteristic, the AEQ/VGA controller 20 corrects the gain AEQ-G of the AEQ/VGA 15 so as to cancel out the change in amplitude (a second gain correction value).

Since the correction allows a gain deviation in a signal band due to the frequency characteristic of the radio circuit and the propagation path to be reduced before a received signal is input to the ADC 17, a number of bits required for the ADC 17 is lowered.

For this reason, the AEQ/VGA controller 20 sets the number of bits ADC-RES of the ADC 17 to a third number of bits L2 (ST305B). Here, L2 is a number of bits sufficient for demodulation and has a smaller value than that of H1 at the time of the frequency characteristic estimation. Alternatively, L1 in ST301B and L2 in ST305B may have the same values. Since a PHY header is short, the number of bits ADC-RES may be kept at H1 for the PHY header 203A.

In ST306B, the radio receiving device 1 receives (demodulates) the PHY header 203A in the state set in ST305B. (Reception in Channel Bonding Mode)

In ST307B, since reception is performed in channel bonding mode (the second training field 201B is received) in a second half of the frame format 200A, the sampling frequency ADC-fs of the ADC 17 is changed to a value fs-H which supports the number of channels to be used. The frequency of the local signal generator 13 is adapted to a center ((f1+f2)/2) for a channel bonding signal.

The radio receiving device 1 sets the frequency characteristic AEQ-F in a signal output from the AEQ/VGA 15 to the value A, at which the frequency characteristic AEQ-F is flat in a signal band.

In the above-described state, the gain controller 19 performs gain correction of the AEQ/VGA 15 (a third gain correction value). The gain controller 19 first performs coarse adjustment using a correction value in a table which is prepared in advance and then performs fine adjustment by linear search.

The correction value in the table here is prepared in advance and is intended for correction of a difference in amplitude between single-channel mode and channel bonding mode. For example, an amplitude is about twice in two-channel bonding, and a value close to ½ is described in the table. Note that the number of bits of the ADC 17 may be set to a different value L2' adapted for training in ST307B.

In ST308B, the gain controller 19 sets the number of bits ADC-RES of the ADC 17 to a fourth number of bits H2 in the state set in ST307B to estimate the frequency characteristic of the radio circuit and the frequency characteristic of the propagation path in channel bonding mode with high accuracy. If the second channel estimation field 202B is received in the above-described state, the DSP 18 estimates the frequency characteristic of the radio circuit and the frequency characteristic of the propagation path in channel bonding mode on the basis of a received signal output from the ADC 17.

In ST309B, the AEQ/VGA controller 20 sets the frequency characteristic AEQ-F of the AEQ/VGA 15 to C such that the frequency characteristic AEQ-F is an inverse of an estimated value from the DSP 18. Since an amplitude of a received signal changes with the change of the frequency characteristic, the AEQ/VGA controller 20 corrects the gain AEQ-G of the AEQ/VGA 15 so as to cancel out the change in amplitude (a fourth gain correction value).

Since the correction allows a gain deviation in a signal band due to the frequency characteristic of the radio circuit and the frequency characteristic of the propagation path in channel bonding mode to be reduced before a received signal is input to the ADC 17, a number of bits required for the ADC 17 is lowered.

For this reason, the AEQ/VGA controller 20 sets the number of bits ADC-RES of the ADC 17 to a fifth number of bits L3. Here, L3 is a number of bits sufficient for channel bonding signal demodulation and has a smaller value than that of H2 at the time of the frequency characteristic estimation.

Here, L1 in ST301B, L2 in ST305B, and L3 in ST309B may have the same values. Alternatively, H1 in ST303B and H2 in ST308B may have the same values.

In ST310B, the radio receiving device 1 receives (demodulates) the payload 204A.

Note that although correction of the gain AEQ-G, setting of the cutoff frequency HPF-fc, setting of the frequency characteristic AEQ-F of the AEQ/VGA 15, and setting of the number of bits ADC-RES are described as being performed in the same step in FIG. 16A, the processes are not always performed simultaneously (in parallel). The processes may be performed in order (serially).

<Effects>

As described above, in the present embodiment, gain correction that copes with a change in amplitude associated with change of the cutoff frequency is performed, and frequency characteristic correction that copes with a change in the frequency characteristic of the radio circuit and the frequency characteristic of the propagation path is performed. Since the frequency characteristic of the radio circuit and the frequency characteristic of the propagation path can be reduced before a received signal is input to the ADC 17, the number of bits used in the ADC 17 can be lowered. Additionally, power consumption of the ADC 17 can be reduced by changing a sampling rate of the ADC 17 in accordance with a bandwidth for a modulated wave to be received.

Fifth Embodiment

A fifth embodiment will describe an activation procedure for a radio receiving device 1 shown in FIGS. 1, 2, and 3 to operate in conformity with IEEE 802.11ay.

The fifth embodiment is different from the fourth embodiment in control flow. Differences from the fourth embodiment will be described below.

FIG. 17B shows ADC setup values for a frame format 200A. Power consumption of an ADC is reduced by making the total of sections with a number of bits of L (smaller than H) as long as possible.

The total of sections with a high sampling frequency is longer, and the total of sections with a smaller number of bits is longer, as compared to the fourth embodiment.

<Control Flow>

Figure 17A:
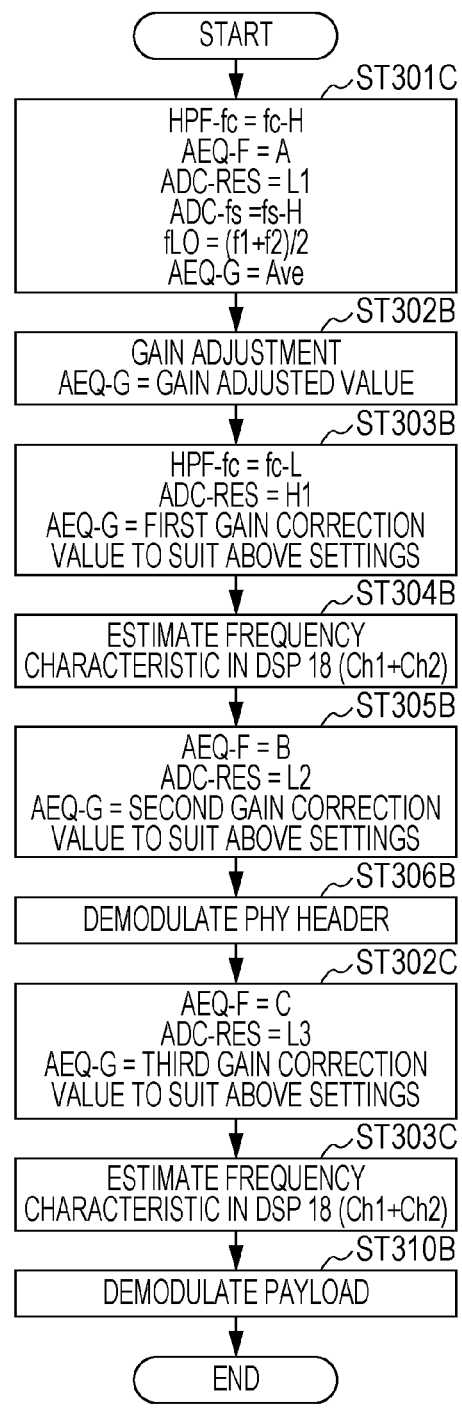
FIG. 17A is a flowchart showing gain adjustment and frequency characteristic and number of bits control in a radio receiving device by the radio receiving device after receipt of a frame format according to a fifth embodiment of the present disclosure.

FIG. 17A is a flowchart showing gain adjustment and frequency characteristic and number of bits control in the radio receiving device 1 by the radio receiving device 1 after receipt of the frame format 200A. Note that the same operations as those in FIG. 16A are denoted by the same reference characters and that a description thereof will be omitted.

(Reception in Single-Channel Mode)

First, in ST301C, the radio receiving device 1 sets a cutoff frequency HPF-fc of an HPF 16 to a first cutoff frequency value fc-H at the start of an AGC period (at the start of a first training field 201A or before reception of the first training field 201A), like the other embodiments.

Reception is performed in single-channel mode in a first half of the frame format 200A. In the flowchart in FIG. 17A, a sampling frequency ADC-fs of an ADC 17 is set to a value fs-H required for channel bonding demodulation to make an operating time at a smaller number of bits longer. This allows reception of single channel signals for two channels even at the time of reception in single-channel mode and grasp of frequency characteristics for both Ch1 and Ch2 in the first half of the frame format. A frequency of a local signal generator 13 is adapted to a center ((f1+f2)/2) for a channel bonding signal.

The radio receiving device 1 sets a frequency characteristic AEQ-F of a signal output from an AEQ/VGA 15 to a value A at which the frequency characteristic AEQ-F is flat in a signal band and a number of bits ADC-RES of the ADC 17 to a first number of bits L1.

The radio receiving device 1 sets a gain AEQ-G of the AEQ/VGA 15 to a standard value Ave.

Note that operations in ST302B to ST306B are the same as those in FIG. 16A and that a description thereof will be omitted. Note that estimation of a frequency characteristic of a radio circuit and a frequency characteristic of a propagation path in ST304B is performed for a band in channel bonding mode (Ch1+Ch2). A value B of the frequency characteristic AEQ-F in ST305B is intended for correction of a frequency characteristic of the band in channel bonding mode (Ch1+Ch2).

(Reception in Channel Bonding Mode)

In ST302C, reception is performed in channel bonding mode in a second half of the frame format.

At the time of reception of a second training field 201B, a bandwidth increases from one in single-channel mode to one in channel bonding mode.

An AEQ/VGA controller 20 sets the frequency characteristic AEQ-F of the AEQ/VGA 15 to C such that the frequency characteristic AEQ-F is an inverse (Ch1+Ch2) of an estimated value from a DSP 18.

Since an amplitude of a received signal changes with the change in bandwidth and the change of the frequency characteristic, the AEQ/VGA controller 20 corrects the gain AEQ-G of the AEQ/VGA 15 so as to cancel out the change in amplitude (a third gain correction value).

The gain controller 19 first performs coarse adjustment using a correction value in a table which is prepared in advance and then performs fine adjustment by linear search.

The correction value in the table here is prepared in advance and is intended for correction of a difference in amplitude and a gain difference based on the AEQ frequency characteristic between single-channel mode and channel bonding mode.

The number of bits ADC-RES of the ADC 17 is set to a number of bits required for channel estimation (after AEQ correction) for and demodulation of a channel bonding signal, a fourth number of bits L3.

Note that, in ST303C, if a second channel estimation field 202B is received in the state set in ST302C, the DSP 18 estimates the frequency characteristic of the radio circuit and the frequency characteristic of the propagation path in channel bonding mode on the basis of a received signal output from the ADC 17.

Note that ST309B in FIG. 16A is not included in FIG. 17A. The flow shifts to ST310B, and the radio receiving device 1 receives (demodulates) a payload 204A.

Note that frequency characteristic correction by an analog equalizer may be performed using a result of the second channel estimation and that a payload unit may change the number of bits to a fifth number of bits L4 smaller than L3.

<Effects>

As described above, in the present embodiment, gain correction that copes with a change in amplitude associated with change of the cutoff frequency is performed, and frequency characteristic correction that copes with a change in the frequency characteristic of the radio circuit and the frequency characteristic of the propagation path is further performed. Since the frequency characteristic of the radio circuit and the frequency characteristic of the propagation path can be reduced before a received signal is input to the ADC 17, the number of bits used in the ADC 17 can be lowered, and power consumption of the ADC 17 can be reduced.

Sixth Embodiment

A sixth embodiment will describe an activation procedure for a radio receiving device 1 shown in FIGS. 1, 2, and 3 to operate in conformity with IEEE 802.11ay. The sixth embodiment is different from the fourth embodiment in control flow. Differences from the fourth embodiment will be described below.

Figure 18A:
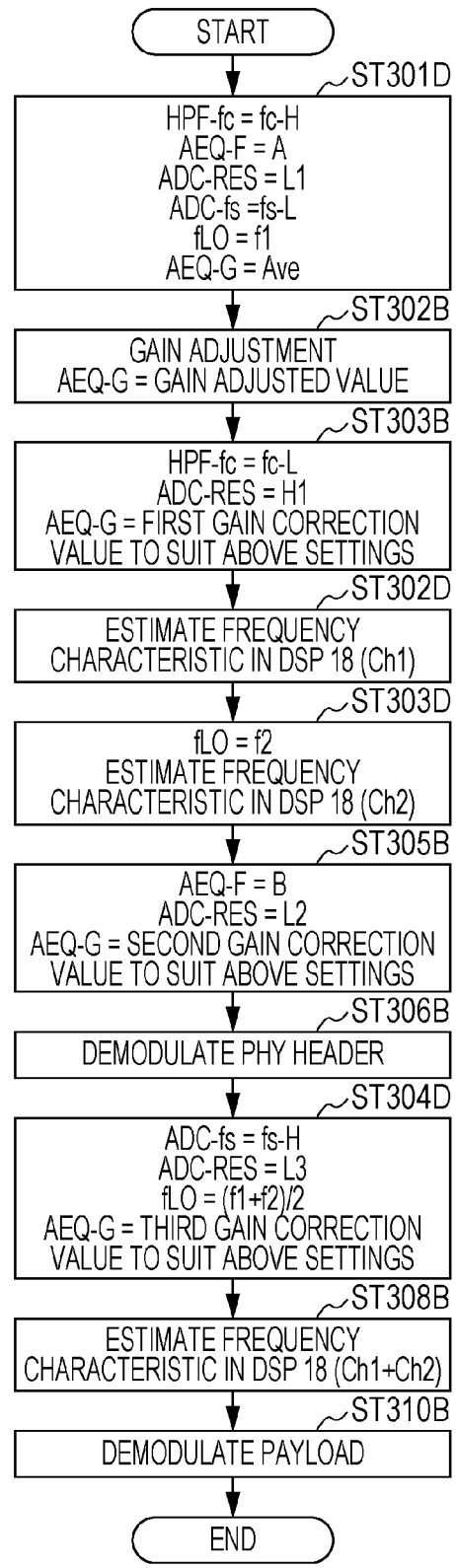
FIG. 18A is a flowchart showing gain adjustment and frequency characteristic and number of bits control in a radio receiving device by the radio receiving device after receipt of a frame format according to a sixth embodiment of the present disclosure.
Figure 18B:
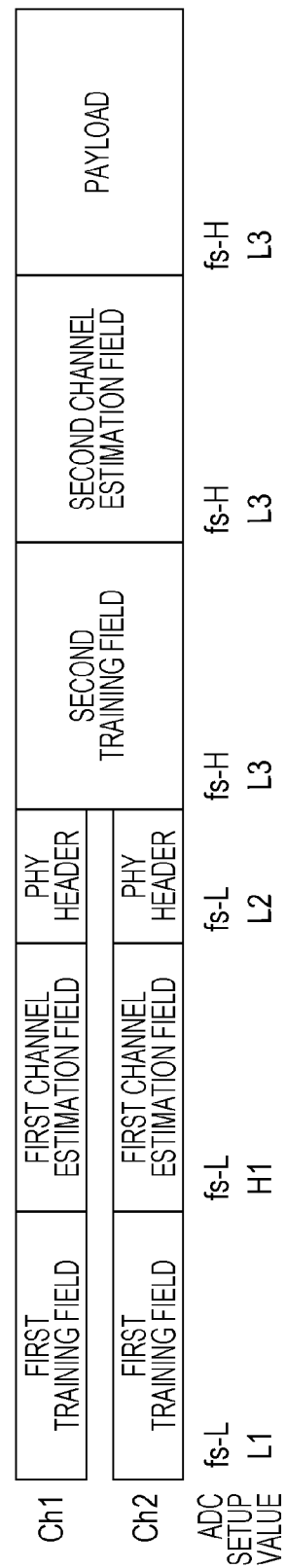
FIG. 18B is a diagram showing ADC setup values for the frame format according to the sixth embodiment of the present disclosure.

FIG. 18B shows ADC setup values for a frame format 200A. Power consumption of an ADC is reduced by making the total of sections with a sampling frequency of fs-L and a number of bits of L (smaller than H) as long as possible.

The number of changes of a local frequency of a receiver is larger, and the total of sections with a smaller number of bits is longer, as compared to the fourth embodiment.

<Control Flow>

FIG. 18A is a flowchart showing gain adjustment and frequency characteristic and number of bits control in the radio receiving device 1 by the radio receiving device 1 after receipt of the frame format 200A. Note that the same operations as those in FIG. 16A are denoted by the same reference characters and that a description thereof will be omitted.

(Reception in Single-Channel Mode)

First, in ST301D, a sampling frequency ADC-fs of an ADC 17 is set to a value fs-L adapted for single-channel demodulation because reception is performed in single-channel mode in a first half of the frame format 200A. A frequency (f1) of a local signal generator 13 is adapted to one of channels which are known in advance from a control packet and are to be used in the first half of the frame format 200A.

The radio receiving device 1 sets a frequency characteristic AEQ-F in a signal output from the AEQ/VGA 15 to a value A at which the frequency characteristic AEQ-F is flat in a signal band and sets a number of bits ADC-RES of the ADC 17 to a first number of bits L1.

The radio receiving device 1 sets a gain AEQ-G of the AEQ/VGA 15 to a standard value Ave.

Note that operations in ST302B and ST303B are the same as those in FIG. 16A and that a description thereof will be omitted.

In ST302D, if a first channel estimation field 202A is received in a state (fLO=f1) set in ST303B, a DSP 18 estimates a frequency characteristic (Ch1) of a radio circuit and a propagation path on the basis of a received signal output from the ADC 17.

In ST303D, the frequency of the local signal generator 13 is adapted to the other single channel (fLO=f2). The DSP 18 estimates a frequency characteristic (Ch2) of the radio circuit and the propagation path on the basis of a received signal output from the ADC 17.

In a circuit or a channel for which a difference in signal amplitude between Ch1 and Ch2 is expected to be large, gain adjustment of a reception circuit may be performed by, for example, linear search after the change of the frequency of the local signal generator 13.

If a difference in signal amplitude between Ch1 and Ch2 is expected to be large, gain adjustment in ST302B and ST303B may be performed for both Ch1 and Ch2. That is, if a difference in signal amplitude between Ch1 and Ch2 is expected to be large, gain adjustment for Ch1 and gain adjustment for Ch2 may be performed in order using different local frequencies for first training fields, gain settings may be held in a table, and channel estimation for Ch1 and channel estimation for Ch2 may be performed in order using the gain settings held in the table for first channel estimation fields. Note that a PHY header for either one of Ch1 and Ch2 is demodulated after the gain setting.

Note that operations in subsequent ST305B and ST306B are the same as those in FIG. 16A and that a description thereof will be omitted.

(Reception in Channel Bonding Mode)

In ST304D, since reception is performed in channel bonding mode (a second training field 201B is received) in a second half of the frame format 200A, the sampling frequency ADC-fs of the ADC 17 is changed to a value fs-H which supports the number of channels to be used. The frequency of the local signal generator 13 is adapted to a center ((f1+f2)/2) for a channel bonding signal.

The number of bits ADC-RES of the ADC 17 is set to a number of bits required for channel estimation (after AEQ correction) for and demodulation of a channel bonding signal, a fourth number of bits L3.

In the above-described state, the gain controller 19 performs gain correction of the AEQ/VGA 15 (a third gain correction value). The gain controller 19 first performs coarse adjustment using a correction value in a table which is prepared in advance and then performs fine adjustment by linear search.

After that, the same operations as those in ST308B and ST310B in FIG. 16A are performed. Frequency characteristic correction by an analog equalizer may be performed using a result of second channel estimation, and a payload unit may change the number of bits to a fifth number of bits L4 smaller than L3.

<Effects>

As described above, in the present embodiment, gain correction that copes with a change in amplitude associated with change of the cutoff frequency is performed, and frequency characteristic correction that copes with a change in the frequency characteristic of the radio circuit and the frequency characteristic of the propagation path is further performed. Since the frequency characteristic of the radio circuit and the frequency characteristic of the propagation path can be reduced before a received signal is input to the ADC 17, the number of bits used in the ADC 17 can be lowered. Additionally, power consumption of the ADC 17 can be reduced by changing a sampling rate of the ADC 17 in accordance with a bandwidth for a modulated wave to be received.

Note that a setup value for the frequency characteristic of the AEQ/VGA 15 and a setup value for the gain after frequency characteristic estimation are not limited to values, at which the frequency characteristic is an inverse of an estimated value, in each of the fourth, fifth, and sixth embodiments and may be values which reduce fluctuations in a frequency characteristic as an estimated value.

Each of the fourth, fifth, and sixth embodiments has described a case where the number of bits of the ADC 17 is set to the first number of bits L1 smaller than the second number of bits H1 in an AGC period. In the present disclosure, the number of bits of the ADC 17 may be set to the second number of bits H1 larger than the first number of bits to detect a signal with a level not higher than a noise level through pattern matching.

A configuration in which one ADC 17 is provided and is used while the number of bits of the ADC 17 is switched has been described as for the ADC 17 in each of the fourth, fifth, and sixth embodiments. In the present disclosure, a plurality of ADCs 17 different in number of bits may be prepared, and the ADC 17 to be used may be switched in accordance with a desired number of bits.

In each of the fourth, fifth, and sixth embodiments, gain adjustment in the radio receiving device 1 may include LNA gain, mixer gain, and local amplitude adjustment.

In each of the fourth, fifth, and sixth embodiments, a CT/DT hybrid circuit in FIG. 6 may be used as an AEQ, as in FIG. 12. In this case, a frequency characteristic correction amount and a bandwidth can be changed on the basis of a clock frequency and a capacitance ratio, and the CT/DT hybrid circuit is adapted for implementation using a fine CMOS. A clock frequency in an AEQ and a clock frequency in an ADC can be made to coordinate with each other, and control is easier.

Note that, in all the embodiments, the demodulation circuit DSP 18 that demodulates a received signal after frequency characteristic correction by an AEQ, using a channel estimation result before the frequency characteristic correction by the AEQ measures, in advance, a change in frequency characteristic which may occur through frequency characteristic correction by the AEQ and processes actual demodulation in view of the amount of change.

Other Embodiments

Although each of the above-described embodiments has illustrated a case where one aspect of the present disclosure is implemented by hardware, the present disclosure can also be implemented by software through cooperation with hardware.

The functional blocks used in the above-described embodiments are typically implemented as LSIs which are integrated circuits. An integrated circuit may control each of the functional blocks used to describe the above-described embodiments and have an input and an output. The functional blocks may be formed into separate chips or one chip may be formed so as to include some or all of the functional blocks. Although the term LSI is used here, an integrated circuit may be referred to as an IC, a system LSI, a super LSI, or an ultra LSI, depending on integration degree.

The method for circuit integration is not limited to LSIs, implementation using dedicated circuits or general-purpose processors is also possible. After LSI manufacture, a field programmable gate array (FPGA) which is programmable or a reconfigurable processor in which connections and settings of circuit cells within an LSI can be reconfigured may be used.

If integrated circuit technology comes out to replace LSIs as a result of advancement of semiconductor technology or other derivative technologies, functional block integration may, of course, be performed using the technology. Application of biotechnology and the like are possible.

A radio receiving device according to the present disclosure includes: a frequency converting circuit which frequency-converts a radio-frequency received signal having a gain adjustment period, a channel estimation period, and a signal reception period into a baseband received signal; at least one frequency characteristic correcting circuit which generates a corrected baseband received signal by amplifying the baseband received signal on the basis of a gain code and correcting a frequency characteristic in the baseband received signal on the basis of a frequency characteristic code; at least one filter circuit which generates a filtered baseband received signal by cutting off a band below a cutoff frequency of the corrected baseband received signal on the basis of a cutoff frequency code; an analog/digital conversion circuit which quantizes the filtered baseband received signal into a digital received signal using a number of bits based on a number of bits code; a digital signal processing circuit which demodulates the digital received signal and estimates a frequency characteristic; and a controller which sets the frequency characteristic code, the gain code, the cutoff frequency code, and the number of bits code.

In the radio receiving device according to the present disclosure, during the gain adjustment period, the controller sets the gain code to an initial value, sets the frequency characteristic code to a first frequency characteristic value, sets the cutoff frequency code to a first cutoff frequency higher than a second cutoff frequency during the channel estimation period, and sets the number of bits code to a first number of bits smaller than a second number of bits during the channel estimation period.

In the radio receiving device according to the present disclosure, after the gain adjustment period, the controller sets the cutoff frequency code to the second cutoff frequency lower than the first cutoff frequency, sets the number of bits code to the second number of bits larger than the first number of bits, and sets the gain code that has a gain adjusted value obtained through gain adjustment to a first gain correction value for correcting an amplitude of the baseband received signal which is changed by the second cutoff frequency.

In the radio receiving device according to the present disclosure, the controller sets the frequency characteristic code to a second frequency characteristic value on the basis of a frequency characteristic of the baseband received signal which is estimated during the channel estimation period, the baseband received signal being amplitude-corrected using the first gain correction value, sets the number of bits code to the first number of bits smaller than the second number of bits, and sets the gain code to a second gain correction value for correcting an amplitude of the baseband received signal which is changed by the second frequency characteristic value.

The radio receiving device according to the present disclosure, the frequency characteristic correcting circuit is configured using a continuous time/discrete time hybrid circuit.

A transmitting and receiving device according to the present disclosure is a transmitting and receiving device including a transmitting device, a receiving device, and a controller. The receiving device includes: a first frequency converting circuit which frequency-converts a radio-frequency received signal having a gain adjustment period, a channel estimation period, and a signal reception period into a baseband received signal, at least one first frequency characteristic correcting circuit which generates a corrected baseband received signal by amplifying the baseband received signal on the basis of a first gain code and correcting a first frequency characteristic in the baseband received signal on the basis of a first frequency characteristic code, at least one first filter circuit which generates a filtered baseband received signal by cutting off a band below a first cutoff frequency of the corrected baseband received signal on the basis of a first cutoff frequency code, an analog/digital conversion circuit which quantizes the filtered baseband received signal a digital received signal using a first number of bits based on a first number of bits code, and a first digital signal processing circuit which demodulates the digital received signal and estimates a first frequency characteristic. The transmitting device includes: a second digital signal processing circuit which modulates transmission data through digital signal processing to a digital transmission signal, a digital/analog conversion circuit which converts the digital transmission signal using a second number of bits based on a second number of bits code to an analog transmission signal, at least one second filter circuit which generates a filtered analog transmission signal by cutting off a band below a second cutoff frequency of the analog transmission signal, at least one second frequency characteristic correcting circuit which amplifies the filtered analog transmission signal on the basis of a second gain code and corrects a second frequency characteristic in the analog transmission signal on the basis of a second frequency characteristic code, and a second frequency converting circuit which frequency-converts the analog transmission signal to a radio-frequency transmission signal. The controller sets the first and second frequency characteristic code, the first and second gain code, the first and second cutoff frequency code, and the first and second number of bits code.

In the transmitting and receiving device according to the present disclosure, the transmitting device further includes a detection circuit which generates a detection signal by detecting the second gain code and the second frequency characteristic in a test signal output from the second frequency converting circuit, the analog/digital conversion circuit converts the detection signal into a digital detection signal and outputs the digital detection signal to the controller each time the test signal is input, and the controller estimates the second frequency characteristic of the transmitting device on the basis of the digital detection signal.

One aspect of the present disclosure is suitably used as a radio receiving device and a transmitting and receiving device for broadband communication which require an analog/digital converter with a sampling rate of several GHz to several tens of GHz.

What is claimed is:

1. A radio receiving device comprising:
   a frequency converting circuit, which, in operation, frequency-converts a radio-frequency received signal having a gain adjustment period, a channel estimation period, and a signal reception period into a baseband received signal, wherein the gain adjustment period, the channel estimation period, and the signal reception period are distinct periods of the radio-frequency received signal;
   at least one frequency characteristic correcting circuit, which, in operation, generates a corrected baseband received signal by amplifying the baseband received signal on the basis of a gain code and correcting a frequency characteristic in the baseband received signal on the basis of a frequency characteristic code;
   at least one filter circuit, which, in operation, generates a filtered baseband received signal by cutting off a band below a cutoff frequency of the corrected baseband received signal on the basis of a cutoff frequency code;
   an analog/digital conversion circuit, which, in operation, quantizes the filtered baseband received signal into a digital received signal using a number of bits based on a number of bits code;
   a digital signal processing circuit, which, in operation, demodulates the digital received signal and estimates a frequency characteristic; and
   a controller, which, in operation, sets the frequency characteristic code, the gain code, the cutoff frequency code, and the number of bits code based on the gain adjustment period, the channel estimation period, and the signal reception period.

2. The radio receiving device according to claim 1, wherein
   during the gain adjustment period,
   the controller
      sets the gain code to an initial value,
      sets the frequency characteristic code to a first frequency characteristic value,
      sets the cutoff frequency code to a first cutoff frequency higher than a second cutoff frequency during the channel estimation period, and
      sets the number of bits code to a first number of bits smaller than a second number of bits during the channel estimation period.

3. The radio receiving device according to claim 2, wherein
   after the gain adjustment period,
   the controller
      sets the cutoff frequency code to the second cutoff frequency lower than the first cutoff frequency,
      sets the number of bits code to the second number of bits larger than the first number of bits, and
      sets the gain code that has a gain adjusted value obtained through gain adjustment to a first gain correction value for correcting an amplitude of the baseband received signal which is changed by the second cutoff frequency.

4. The radio receiving device according to claim 3, wherein
   the controller
      sets the frequency characteristic code to a second frequency characteristic value on the basis of a frequency characteristic of the baseband received signal which is estimated during the channel estimation period, the baseband received signal being amplitude-corrected using the first gain correction value,
      sets the number of bits code to the first number of bits smaller than the second number of bits, and
      sets the gain code to a second gain correction value for correcting an amplitude of the baseband received signal which is changed by the second frequency characteristic value.

5. The radio receiving device according to claim 1, wherein
   the frequency characteristic correcting circuit is configured using a continuous time/discrete time hybrid circuit.

6. A transmitting and receiving device comprising:
   a transmitting device;
   a receiving device; and
   a controller, wherein
   the receiving device includes
      a first frequency converting circuit, which, in operation, frequency-converts a radio-frequency received signal having a gain adjustment period, a channel estimation period, and a signal reception period into a baseband received signal,
      at least one first frequency characteristic correcting circuit, which, in operation, generates a corrected baseband received signal by amplifying the baseband received signal on the basis of a first gain code and correcting a first frequency characteristic in the baseband received signal on the basis of a first frequency characteristic code,
      at least one first filter circuit, which, in operation, generates a filtered baseband received signal by cutting off a band below a first cutoff frequency of the corrected baseband received signal on the basis of a cutoff frequency code,
      an analog/digital conversion circuit, which, in operation, quantizes the filtered baseband received signal a digital received signal using a first number of bits based on a first number of bits code, and
a first digital signal processing circuit, which, in operation, demodulates the digital received signal and estimates a first frequency characteristic,
the transmitting device includes
a second digital signal processing circuit, which, in operation, modulates transmission data through digital signal processing to a digital transmission signal,
a digital/analog conversion circuit, which, in operation, converts the digital transmission signal using a second number of bits based on a second number of bits code to an analog transmission signal,
at least one second filter circuit, which, in operation, generates a filtered analog transmission signal by cutting off a band below a second cutoff frequency of the analog transmission signal,
at least one second frequency characteristic correcting circuit, which, in operation, amplifies the filtered analog transmission signal on the basis of a second gain code and corrects a second frequency characteristic in the analog transmission signal on the basis of a second frequency characteristic code, and
a second frequency converting circuit, which, in operation, frequency-converts the analog transmission signal to a radio-frequency transmission signal, and
the controller, in operation, sets the first and second frequency characteristic code, the first and second gain code, the cutoff frequency code, and the first and second number of bits code.

7. The transmitting and receiving device according to claim 6, wherein
the transmitting device further includes a detection circuit, which, in operation, generates a detection signal by detecting the second gain code and the second frequency characteristic in a test signal output from the second frequency converting circuit,
the analog/digital conversion circuit, in operation, converts the detection signal into a digital detection signal and outputs the digital detection signal to the controller each time the test signal is input, and
the controller, in operation, estimates the second frequency characteristic of the transmitting device on the basis of the digital detection signal.

8. A radio receiving device comprising:
a frequency converting circuit, which, in operation, frequency-converts a radio-frequency received signal having a gain adjustment period, a channel estimation period, and a signal reception period into a baseband received signal;
at least one frequency characteristic correcting circuit, which, in operation, generates a corrected baseband received signal by amplifying the baseband received signal on the basis of a gain code and correcting a frequency characteristic in the baseband received signal on the basis of a frequency characteristic code;
at least one filter circuit, which, in operation, generates a filtered baseband received signal by cutting off a band below a cutoff frequency of the corrected baseband received signal on the basis of a cutoff frequency code;
an analog/digital conversion circuit, which, in operation, quantizes the filtered baseband received signal into a digital received signal using a number of bits based on a number of bits code;
a digital signal processing circuit, which, in operation, demodulates the digital received signal and estimates a frequency characteristic; and
a controller, which, in operation, sets the frequency characteristic code, the gain code, the cutoff frequency code, and the number of bits code,
wherein during the gain adjustment period, the controller
sets the cutoff frequency code to a first cutoff frequency higher than a second cutoff frequency during the channel estimation period, and
sets the number of bits code to a first number of bits smaller than a second number of bits during the channel estimation period.

9. The radio receiving device according to claim 8, wherein during the gain adjustment period, the controller
sets the gain code to an initial value, and
sets the frequency characteristic code to a first frequency characteristic value.

10. The radio receiving device according to claim 9, wherein
after the gain adjustment period,
the controller
sets the cutoff frequency code to the second cutoff frequency lower than the first cutoff frequency,
sets the number of bits code to the second number of bits larger than the first number of bits, and
sets the gain code that has a gain adjusted value obtained through gain adjustment to a first gain correction value for correcting an amplitude of the baseband received signal which is changed by the second cutoff frequency.

11. The radio receiving device according to claim 10, wherein
the controller
sets the frequency characteristic code to a second frequency characteristic value on the basis of a frequency characteristic of the baseband received signal which is estimated during the channel estimation period, the baseband received signal being amplitude-corrected using the first gain correction value,
sets the number of bits code to the first number of bits smaller than the second number of bits, and
sets the gain code to a second gain correction value for correcting an amplitude of the baseband received signal which is changed by the second frequency characteristic value.

* * * * *